United States Patent
Yamasaki

(10) Patent No.: US 12,247,874 B2
(45) Date of Patent: *Mar. 11, 2025

(54) PHOTOELECTRIC CONVERSION DEVICE, IMAGING SYSTEM, LIGHT DETECTION SYSTEM, AND MOBILE BODY

(71) Applicant: CANON KABUSHIKI KAISHA, Tokyo (JP)

(72) Inventor: Shogo Yamasaki, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/499,642

(22) Filed: Nov. 1, 2023

(65) Prior Publication Data

US 2024/0060819 A1 Feb. 22, 2024

Related U.S. Application Data

(63) Continuation of application No. 18/145,442, filed on Dec. 22, 2022, now Pat. No. 11,835,386.

(30) Foreign Application Priority Data

Jan. 1, 2022 (JP) ................................ 2022-000027

(51) Int. Cl.
*G01J 1/44* (2006.01)
*H01L 31/107* (2006.01)

(52) U.S. Cl.
CPC .............. *G01J 1/44* (2013.01); *H01L 31/107* (2013.01); *G01J 2001/442* (2013.01); *G01J 2001/4466* (2013.01)

(58) Field of Classification Search
CPC .................. G01J 1/44; G01J 2001/442; G01J 2001/4466; H01L 31/107
See application file for complete search history.

(56) References Cited

U.S. PATENT DOCUMENTS 11,835,386 B2 * 12/2023 Yamasaki ............ H04N 25/773
2012/0057059 A1 * 3/2012 Eldesouki ............ H04N 25/533
348/E5.091
2015/0163429 A1 6/2015 Dai

FOREIGN PATENT DOCUMENTS

JP 2020-28081 A 2/2020
JP 2021-93583 A 6/2021

* cited by examiner

*Primary Examiner* — Thanh Luu
(74) *Attorney, Agent, or Firm* — VENABLE LLP

(57) ABSTRACT

A photoelectric conversion device according to an embodiment of the present disclosure includes an avalanche photodiode, a pulse generation unit that converts an output from the avalanche photodiode into a pulse signal, a pulse count unit that counts the pulse signal and outputs a pulse count value, a time count unit that outputs a time count value indicating a time from the start of operation of the pulse generation unit, an output unit that, when the pulse count value does not exceed a threshold value, outputs the pulse count value, and when the pulse count value exceeds the threshold value, ends counting in the pulse count unit and outputs the time count value at the time of the pulse count value exceeding the threshold value, and a threshold calculation unit that calculates the threshold value using the time count value.

20 Claims, 35 Drawing Sheets

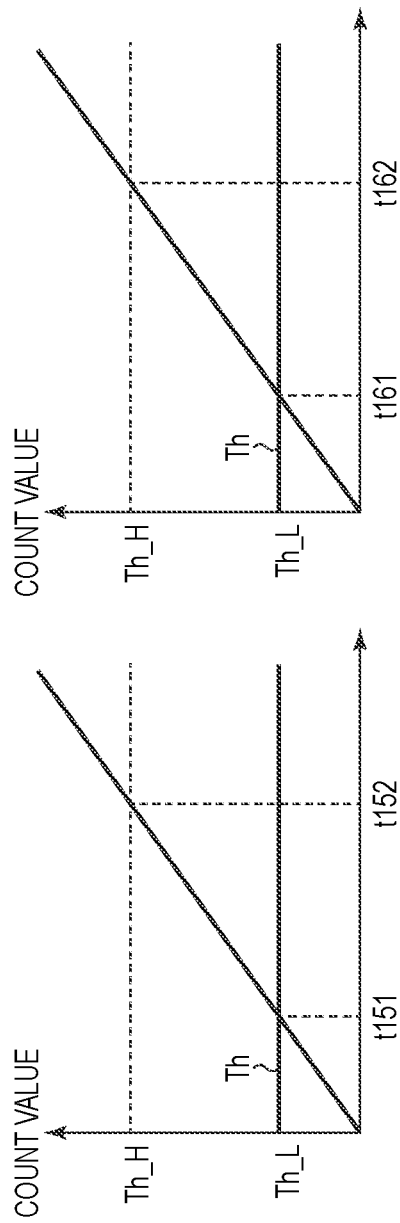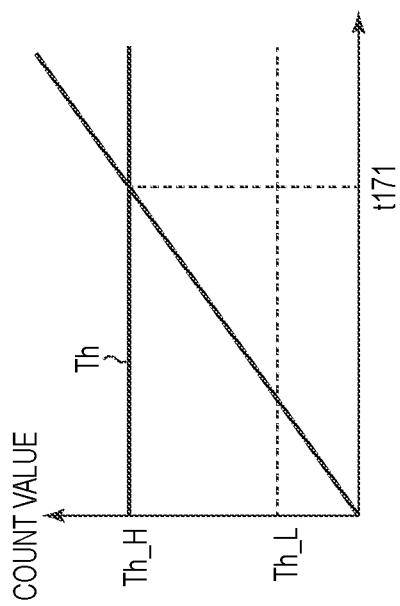

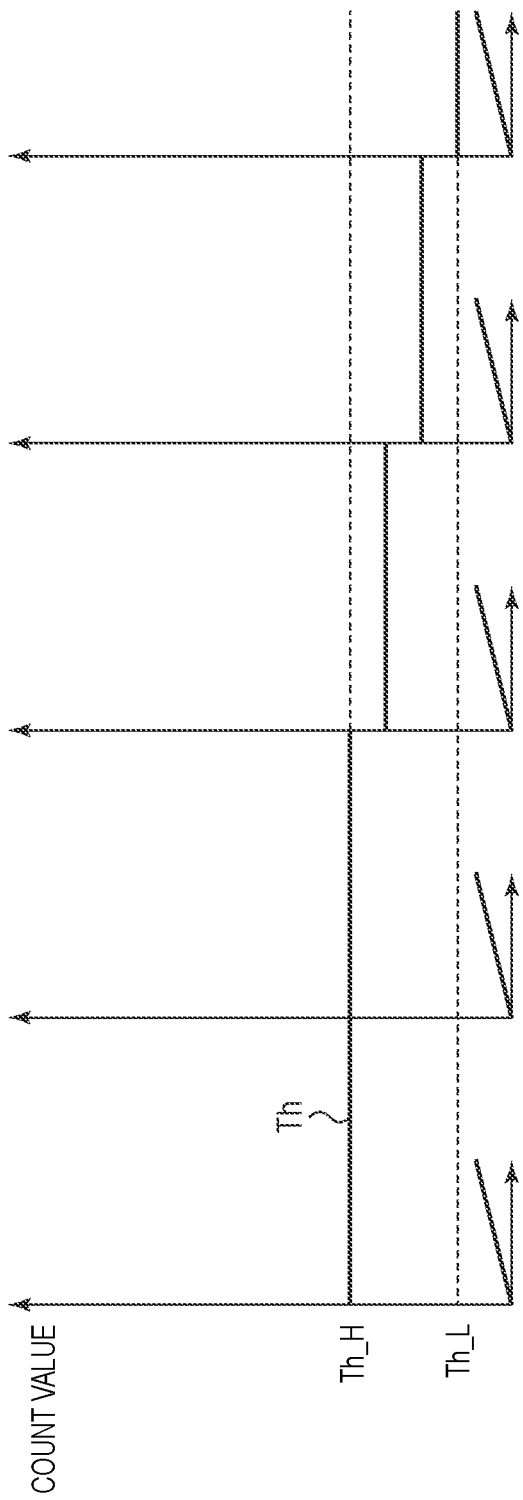

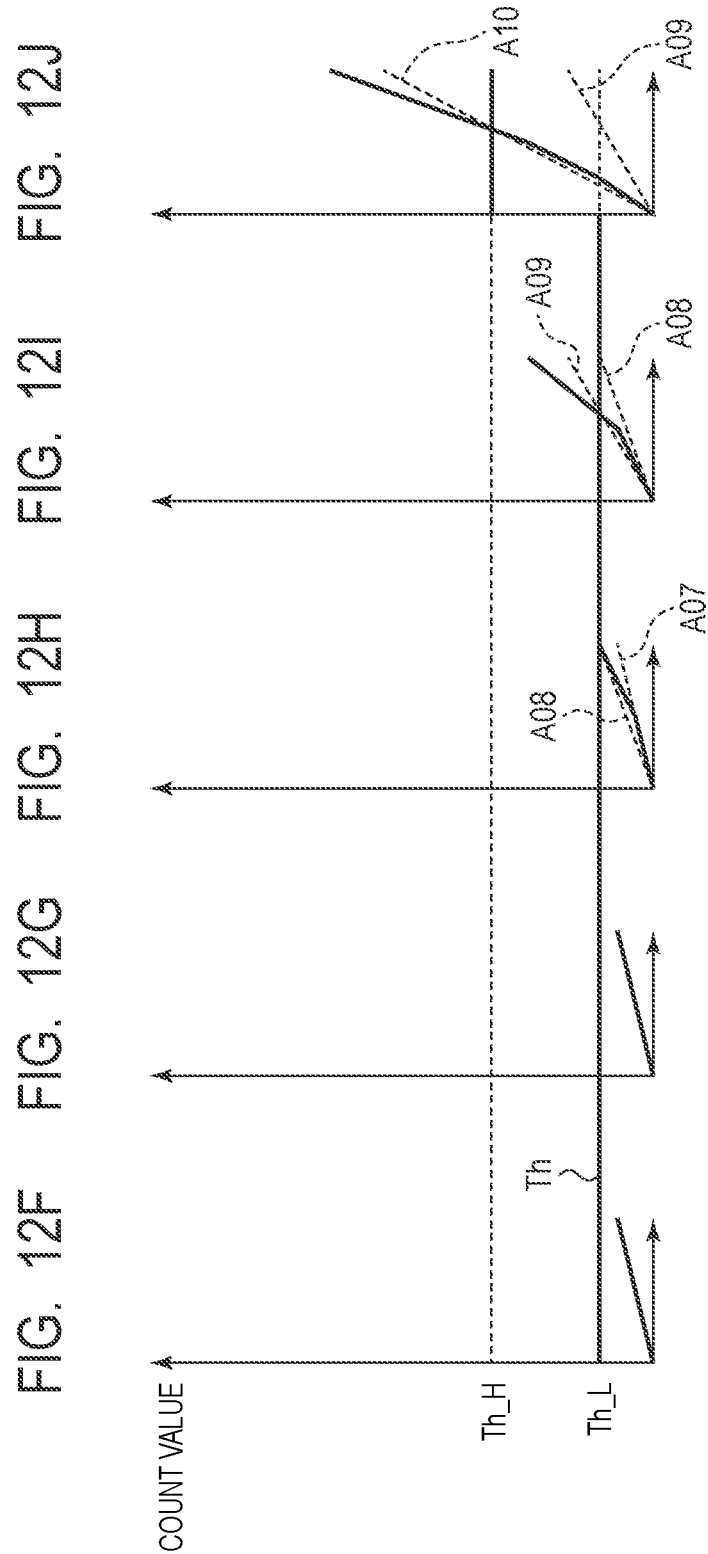

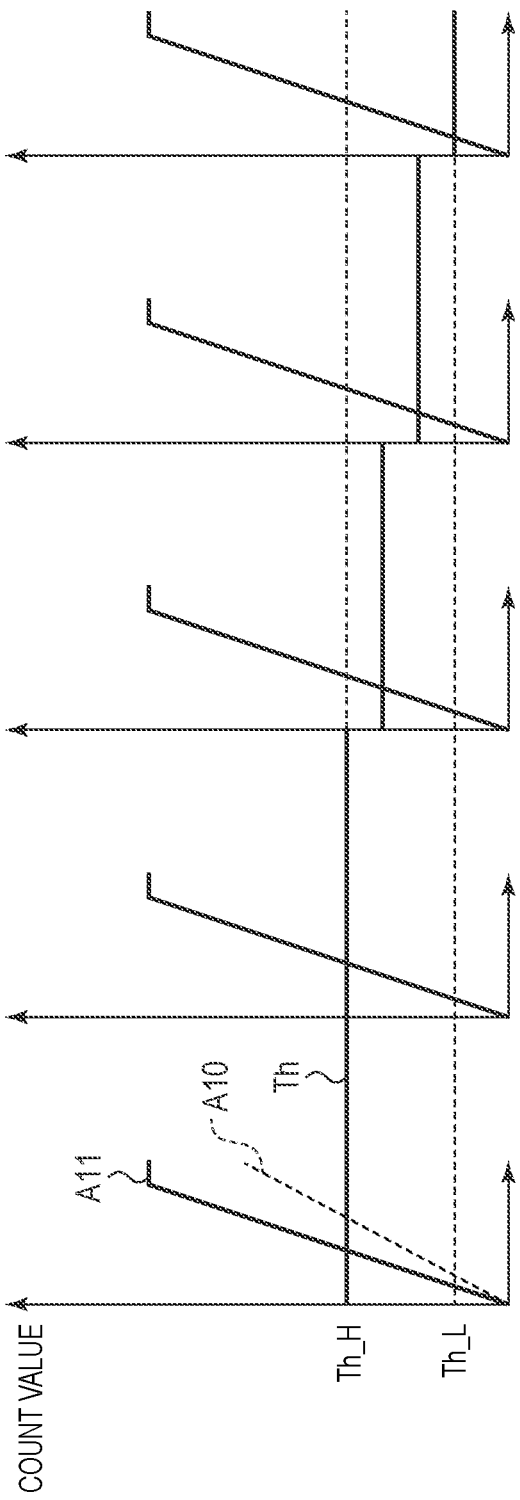

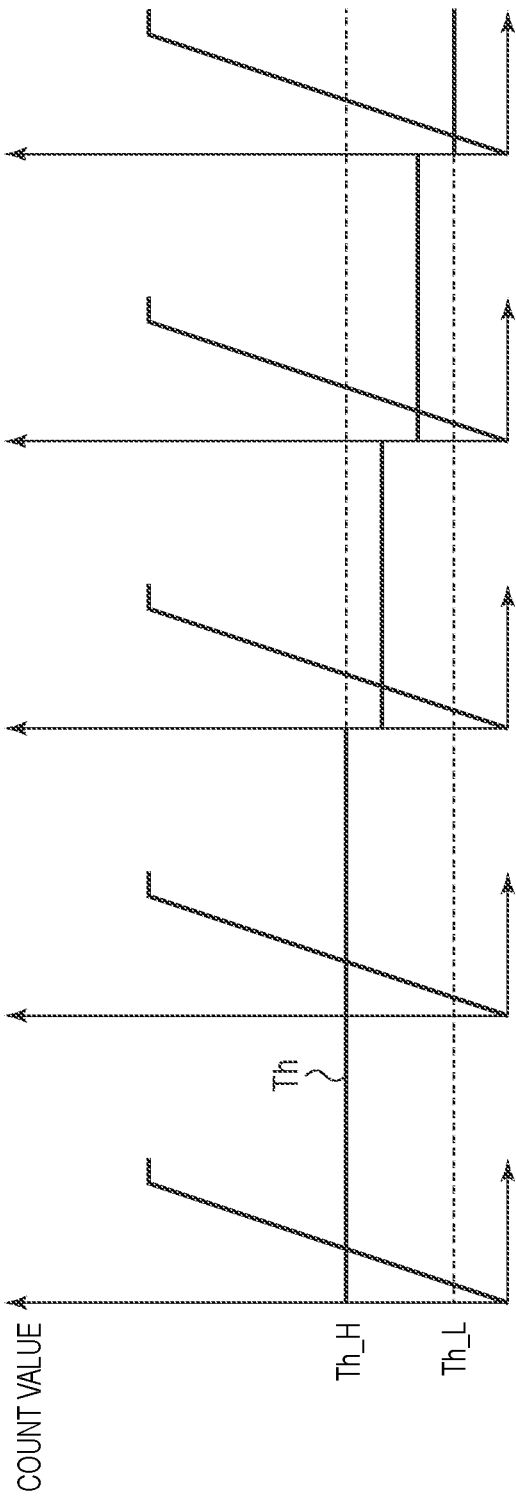

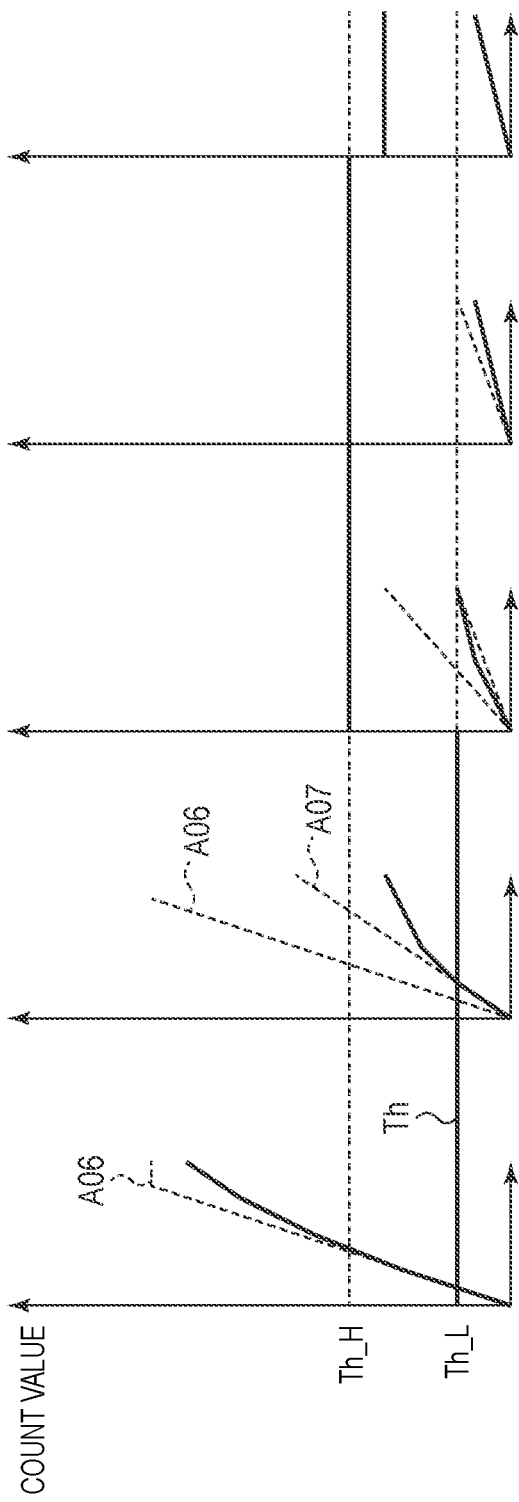

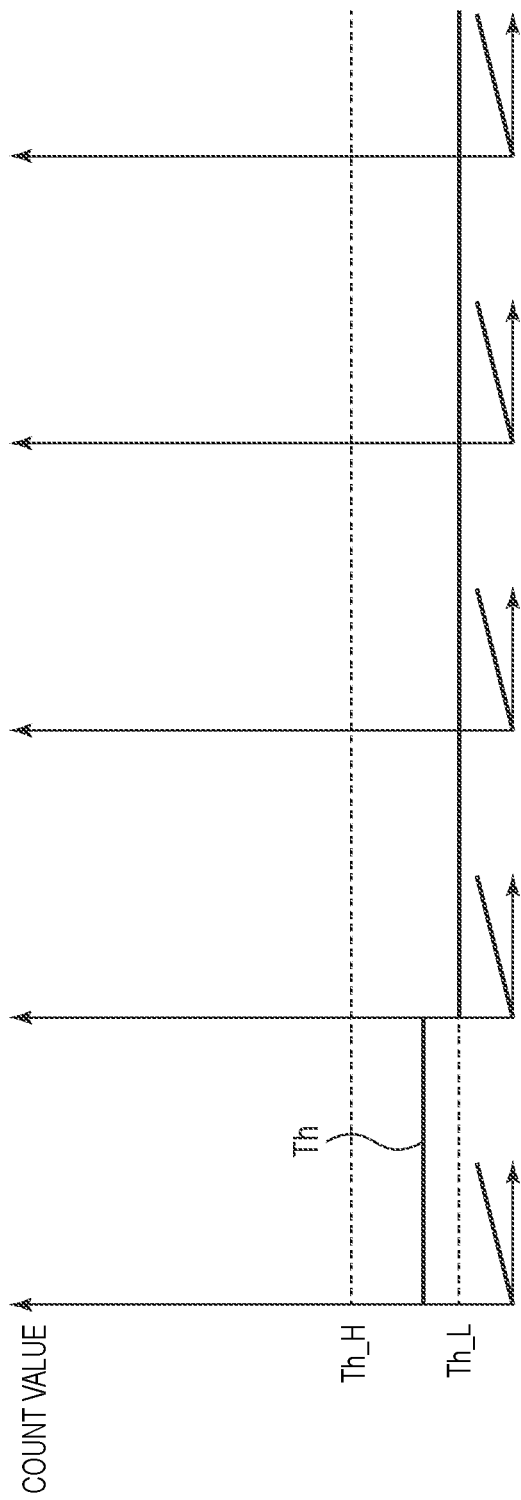

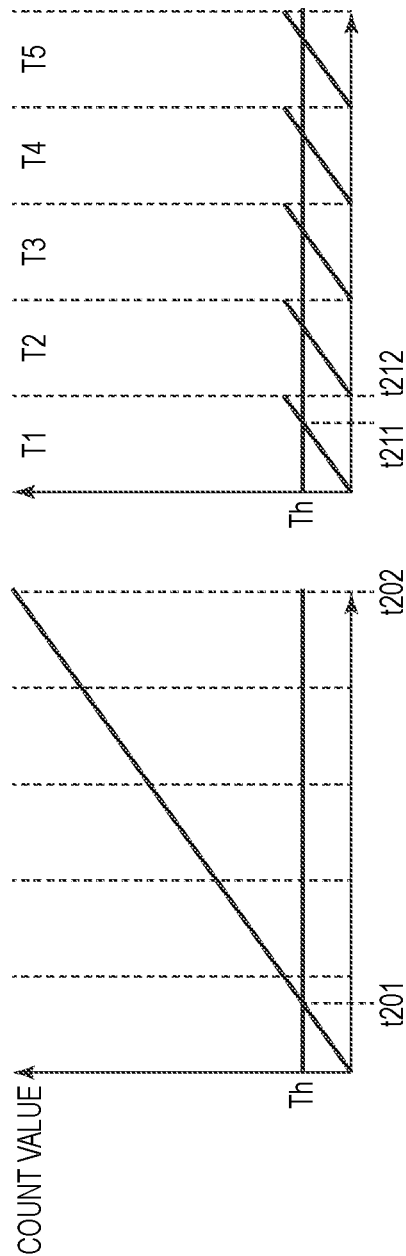

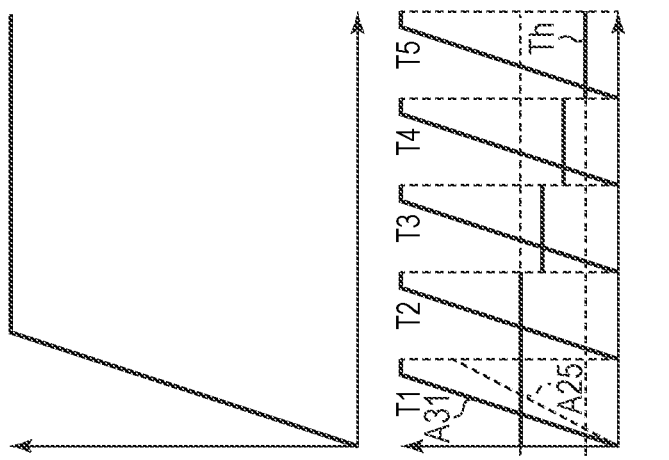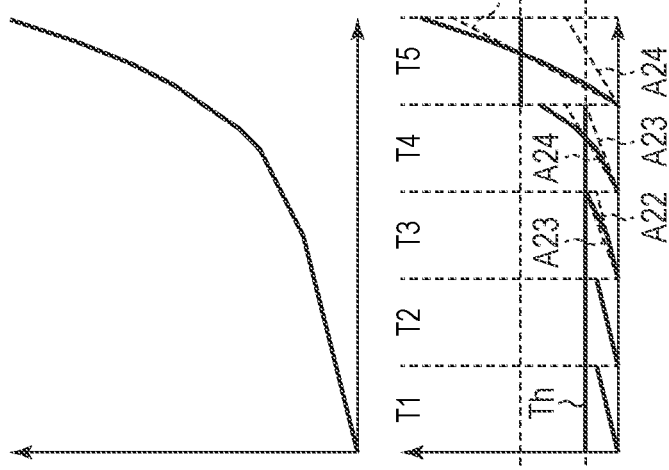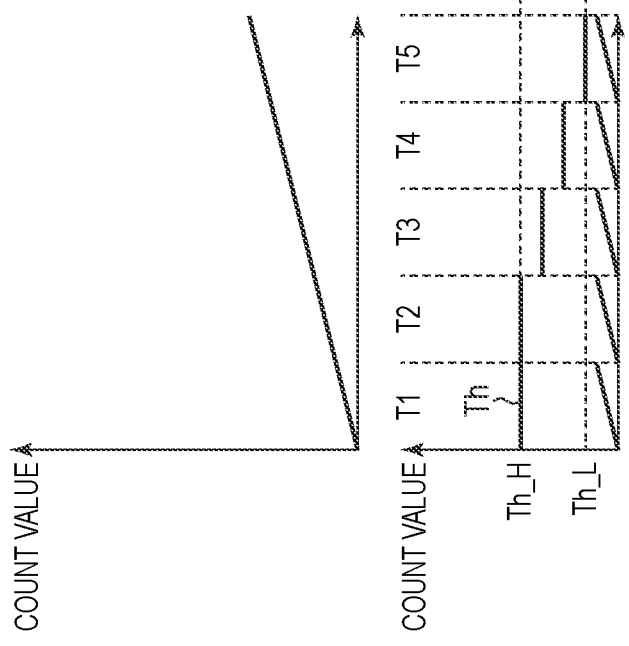

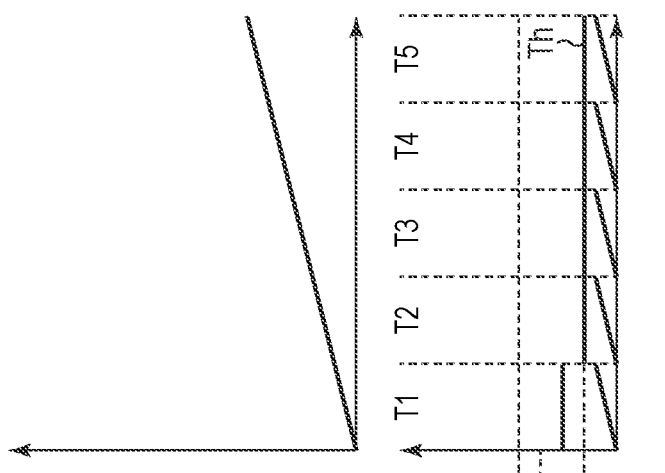
FIG. 18A  FIG. 18B  FIG. 18C
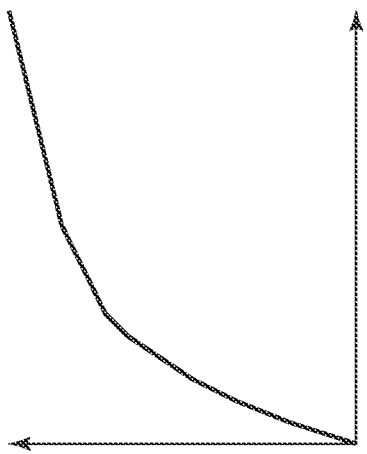
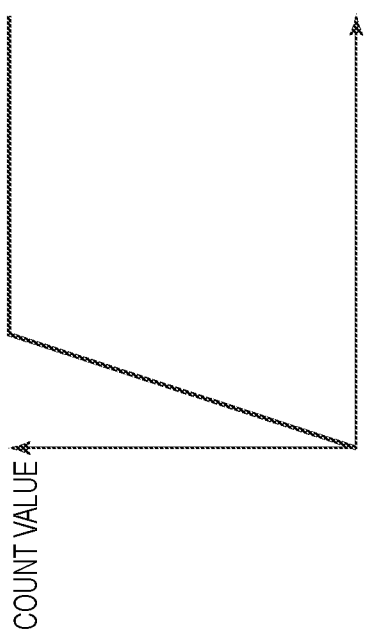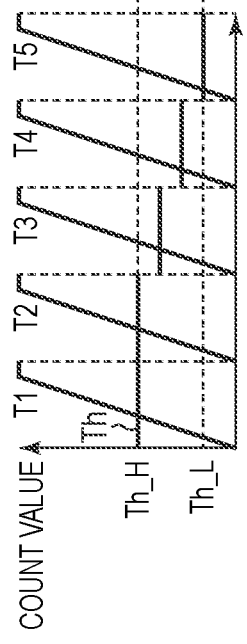

PHOTOELECTRIC CONVERSION DEVICE, IMAGING SYSTEM, LIGHT DETECTION SYSTEM, AND MOBILE BODY

This application is a continuation of U.S. Patent Application Ser. No. 18/145,442 filed Dec. 22, 2022, the contents of which are incorporated by reference herein.

BACKGROUND OF THE INVENTION

Field of the Invention

The present invention relates to a photoelectric conversion device, an imaging system, a light detection system, and a mobile body.

Description of the Related Art

There is known a photon counting type photoelectric conversion device which counts the number of photons incident on a photodiode during an exposure period and outputs the counted value as a signal value. As a method of realizing the photon counting, a method using an avalanche photodiode and a counter has been proposed. When a reverse bias voltage higher than a breakdown voltage is applied to the avalanche photodiode, a carrier generated by incident of a single photon causes avalanche multiplication, and a large current is generated. A signal value corresponding to the number of photons incident on the avalanche photodiode can be obtained by counting the pulse signals based on the current by the counter circuit. On the other hand, a large current is generated every time a photon is incident on a plurality of pixels. When high luminance light continues to be incident on an image sensor having a large number of pixels, current continues to be repeatedly generated in many pixels, and power consumption increases. In order to solve the problem, a technique for reducing power consumption due to incident of high luminance light has been proposed.

According to the technique described in Japanese Patent Application Laid-Open No. 2020-28081, it is determined whether or not to perform pulse counting in next sub-frames based an amount of a count value of photons of a current sub-frame. When the count value of the sub-frame is high, the pulse count is not performed in the next sub-frames, and the preceding count value is output. According to the technology described in Japanese Patent Application Laid-Open No. 2021-93583, a count value of high luminance that exceeds a threshold value is estimated based on a slope of an increase in the count value at a time when the count value exceeds the threshold value, and the estimated count value is output.

SUMMARY OF THE INVENTION

In the technique described in the Japanese Patent Application Laid-Open No. 2020-28081, when a subject to be photographed changes, an error between the actual number of photons and the pulse count value becomes large, and a correct image signal cannot be obtained. In addition, in the technology described in the Japanese Patent Application Laid-Open No. 2021-93583, current consumption cannot be reduced more than the current value corresponding to a predetermined threshold value.

It is an object of the present invention to reduce current consumption while reducing errors in an image signal.

A photoelectric conversion device according to an embodiment of the present disclosure includes an avalanche photodiode; a pulse generation unit that converts an output from the avalanche photodiode into a pulse signal, a pulse count unit that counts the pulse signal and outputs a pulse count value, a time count unit that outputs a time count value indicating a time from the start of operation of the pulse generation unit; an output unit that, when the pulse count value does not exceed a threshold value, outputs the pulse count value, and when the pulse count value exceeds the threshold value, ends counting in the pulse count unit and outputs the time count value at the time of the pulse count value exceeding the threshold value; and a threshold calculation unit that calculates the threshold value using the time count value.

Further features of the present invention will become apparent from the following description of exemplary embodiments with reference to the attached drawings.

BRIEF DESCRIPTION OF THE DRAWINGS

FIGS. 11E, 11F and 11G are diagrams for explaining the operation of the photoelectric conversion device according to the first embodiment.

FIGS. 12A, 12B, 12C, 12D, 12E, 12F, 12G, 12H, 12I, 12J, 12K, 12L, 12M, 12N and 12O are diagrams for explaining the operation of the photoelectric conversion device according to the first embodiment.

FIGS. 13A, 13B, 13C, 13D, 13E, 13F, 13G, 13H, 13I, 13J, 13K, 13L, 13M, 13N and 13O are diagrams for explaining the operation of the photoelectric conversion device according to the first embodiment.

FIGS. 14A and 14B are diagrams for explaining the operation of a photoelectric conversion device according to a second embodiment.

FIGS. 17A, 17B, and 17C are diagrams for explaining the operation of the photoelectric conversion device according to the second embodiment.

FIGS. 18A, 18B, and 18C are diagrams for explaining the operation of the photoelectric conversion device according to the second embodiment.

DESCRIPTION OF THE EMBODIMENTS

Figure 1:
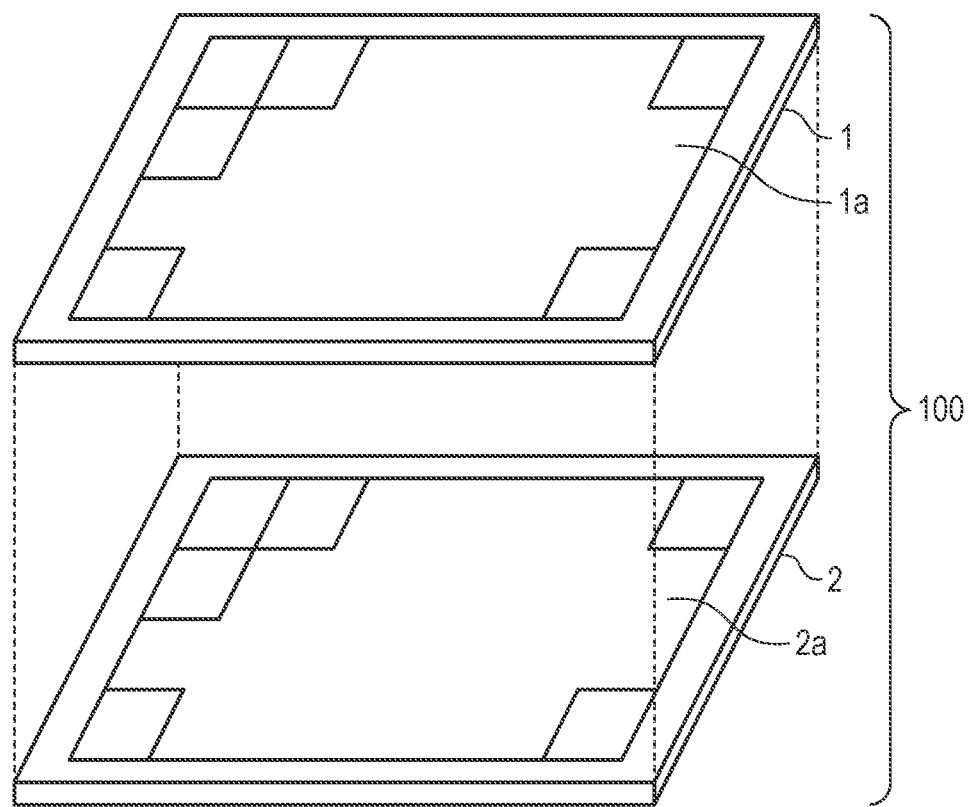
FIG. 1 is a schematic diagram of a photoelectric conversion device according to a first embodiment.

Embodiments of the present invention will be described below with reference to the accompanying drawings. The following embodiments are intended to embody the technical idea of the present invention and do not limit the present invention. The sizes and positional relationships of the members shown in the drawings may be exaggerated for clarity of explanation. In the following description, the same components are denoted by the same reference numerals, and description thereof may be omitted.

First Embodiment

The configuration of the photoelectric conversion device according to the present embodiment will be described with reference to FIGS. 1 to 4. The photoelectric conversion device includes SPAD pixels each including an avalanche photodiode (hereinafter referred to as "APD"). Of charge pairs generated in the APD, a conductivity type of charge used as a signal charge is referred to as a first conductivity type. The first conductivity type refers to a conductivity type in which a charge having the same polarity as the signal charge is used as a majority carrier. Further, a conductivity type opposite to the first conductivity type is referred to as a second conductivity type. The following explanation describes an example in which the signal charges are electrons, the first conductivity type is N-type, and the second conductivity type is P-type. However, the signal charges may be holes, the first conductivity type may be P-type, and the second conductivity type may be N-type.

In this specification, the term "plan view" refers to a view from a direction perpendicular to a light incident surface of a semiconductor substrate described later. The "cross section" refers to a surface in a direction perpendicular to the light incident surface of the sensor substrate 1. When the light incident surface of the semiconductor layer is a rough surface when viewed microscopically, a planar view is defined with reference to the light incident surface of the semiconductor layer when viewed macroscopically. The "depth direction" is a direction from the light incident surface (first surface) of the sensor substrate 1 toward the surface (second surface) on which the circuit substrate 2 is arranged.

FIG. 1 is a schematic diagram of a photoelectric conversion device according to the present embodiment, and shows a configuration of a stacked photoelectric conversion device 100. The photoelectric conversion device 100 includes a sensor substrate (first substrate) 1 and a circuit substrate (second substrate) 2 stacked on each other, and the sensor substrate 1 and the circuit substrate 2 are electrically connected to each other. The photoelectric conversion device according to the present embodiment is a back-illuminated photoelectric conversion device in which light is incident from a first surface of the sensor substrate 1 and the circuit substrate 2 is arranged on a second surface of the sensor substrate 1. The sensor substrate 1 includes a first semiconductor layer having photoelectric conversion elements described later and a first wiring structure. The circuit substrate 2 includes a second semiconductor layer having a circuit such as a signal processing unit described later and a second wiring structure. The photoelectric conversion device 100 is formed by stacking the second semiconductor layer, the second wiring structure, the first wiring structure, and the first semiconductor layer in this order.

Hereinafter, the sensor substrate 1 and the circuit substrate 2 may be diced chips, but are not limited to chips. For example, each substrate may be a wafer. Further, each substrate may be diced after being laminated in a wafer state, or chips may be stacked and bonded after being formed into chips. The sensor substrate 1 is provided with a pixel region 1a, and the circuit substrate 2 is provided with a circuit region 2a for processing a signal detected by the pixel region 1a.

Figure 2:
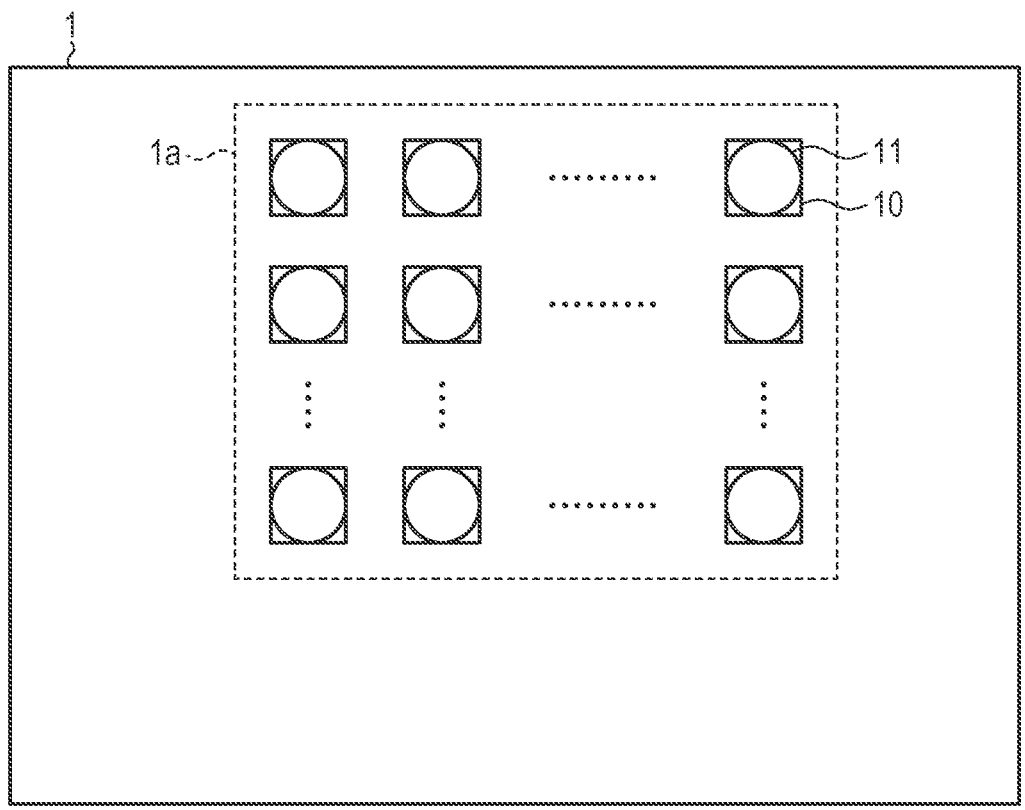
FIG. 2 is a diagram illustrating an arrangement example of a sensor substrate in the first embodiment.

FIG. 2 is a diagram illustrating an arrangement example of the sensor substrate 1. The plurality of pixels 10 each include an APD 11, and are arranged in a two-dimensional array in a plan view to form a pixel region 1a.

The pixel 10 is typically a pixel for forming an image, but when it is used in a TOF (Time of Flight), the pixel 10 does not necessarily need to form an image. That is, the pixel 10 may be a pixel for measuring the time at which light reaches and the amount of light.

Figure 3:
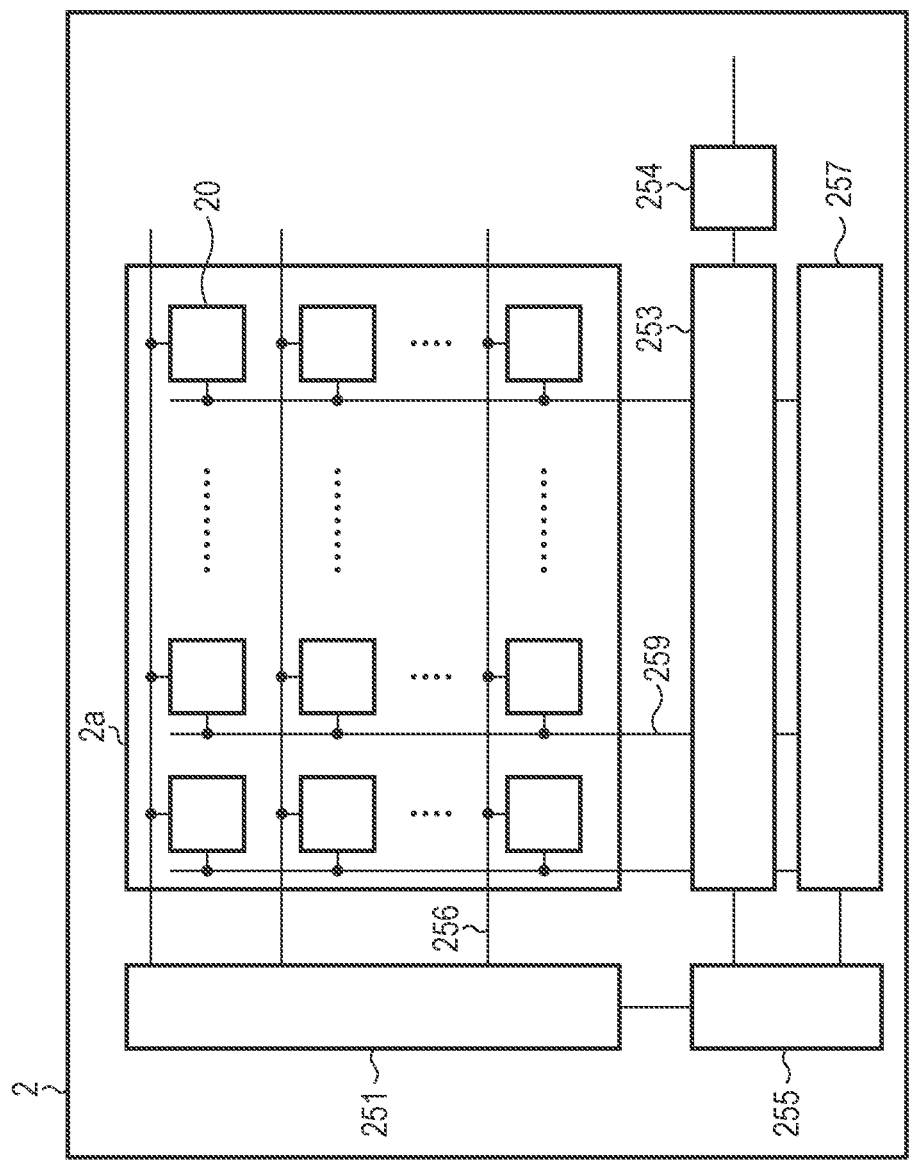
FIG. 3 is a diagram illustrating an arrangement example of a circuit substrate according to the first embodiment.

FIG. 3 is a diagram illustrating an arrangement example of the circuit substrate 2. The circuit substrate 2 includes a signal processing unit 20, a vertical scanning circuit 251, a readout circuit 253, a horizontal scanning circuit 257, an output calculation unit 254, a control pulse generation circuit 255, a scanning line 256, and a signal line 259. The circuit region 2a is arranged in a region overlapping the pixel region 1a in FIG. 2 in a plan view. Further, in the plan view in FIG. 2, a vertical scanning circuit 251, a readout circuit 253, a horizontal scanning circuit 257, an output calculation unit 254, and a control pulse generation circuit 255 are disposed so as to overlap with a region between the edge of the sensor substrate 1 and the edge of the pixel region 1a. That is, the sensor substrate 1 has a pixel region 1a and a non-pixel region arranged around the pixel region 1a, and a vertical scanning circuit 251, a readout circuit 253, a horizontal scanning circuit 257, an output calculation unit 254, and a control pulse generation circuit 255 are arranged in a region overlapping the non-pixel region in a plan view.

The signal processing units 20 are electrically connected to the pixels 10 through connection wirings each provided for the pixel 10, and are arranged in a two-dimensional array in a plan view, similarly to the pixels 10. The signal processing unit 20 includes a binary counter that counts photons incident on the pixel 10.

The vertical scanning circuit 251 receives a control pulse supplied from the control pulse generation circuit 255, and supplies the control pulse to the signal processing unit 20 corresponding to the pixels 10 in each row via the scanning line 256. The vertical scanning circuit 251 may include a logic circuit such as a shift register or an address decoder.

The readout circuit 253 acquires a pulse count value of a digital signal from the signal processing unit 20 of each row via the signal line 259. Then, an output signal is output to a signal processing circuit (signal processing device) outside the photoelectric conversion device 100 via the output calculation unit 254. The readout circuit 253 may have a function of a signal processing circuit for correcting the pulse count value or the like. The horizontal scanning circuit 257 receives the control pulse from the control pulse generation circuit 255, and sequentially outputs the pulse count value of each column in the readout circuit 253 to the output calculation unit 254. As described later, when the pulse count value exceeds a threshold value, the output calculation unit 254 estimates an actual image signal (pulse count value) based on the time count value included in additional information and the threshold value, and replaces (extrapolates) the pulse count value with the estimated pulse count value. On the other hand, when the pulse count value is equal to or smaller than the threshold value, the pulse count value is output as an image signal as it is.

The output calculation unit 254 performs a predetermined process on the pulse count value read by the readout circuit 253, and outputs an image signal to the outside. As will be described later, when the pulse count value exceeds the threshold value, the output calculation unit 254 can perform processing such as calculation of the pulse count value.

In FIG. 2, the arrangement of photoelectric conversion elements in the pixel region may be one-dimensionally arranged. In addition, the effect of the present invention can be achieved even in a configuration in which one pixel is provided, and a configuration in which one pixel is provided can be included in the present invention. In the photoelectric conversion device having a plurality of pixels, the effect of suppressing the circuit scale according to the present embodiment becomes more significant. It is not necessary to provide one signal processing unit 20 for every pixel 10. For example, one signal processing unit 20 may be shared by a plurality of pixels 10 and signal processing may be sequentially performed.

Figure 4:
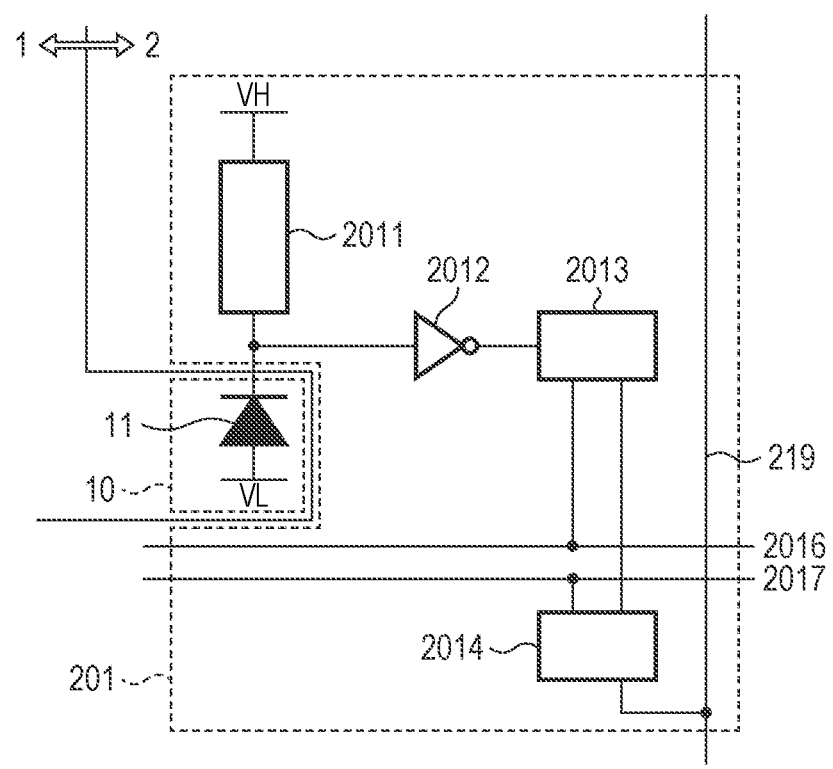
FIG. 4 is a circuit diagram of an APD and a pulse generator according to the first embodiment.

FIG. 4 is a block diagram of the APD and a pulse generation unit according to the present embodiment. FIG. 4 illustrates the pixels 10 of the sensor substrate 1 and a pulse generation unit 201 in the signal processing unit 20 of the circuit substrate 2. The APD 11 is disposed in the pixel 10. The pulse generation unit 201 includes a quenching element 2011, a waveform shaping unit 2012, a counter circuit 2013, and a selection circuit 2014.

The APD 11 generates charge pairs corresponding to incident light by photoelectric conversion. A voltage VL (first voltage) is supplied to an anode of the APD 11. A voltage VH (second voltage) higher than the voltage VL supplied to the anode is supplied to a cathode of the APD 11. A reverse bias voltage is applied to the anode and the cathode, and the APD 11 is in a state capable of avalanche multiplication. When photons enter the APD 11 in a state where the reverse bias voltage is supplied, charges generated by the photons cause avalanche multiplication, and an avalanche current is generated.

The APD 11 can operate in a Geiger mode or a linear mode according to the voltage of the reverse bias. The Geiger mode is an operation in a state where the potential difference between the anode and the cathode is higher than the breakdown voltage, and the linear mode is an operation in a state where the potential difference between the anode and the cathode is near or lower than a breakdown voltage. An APD operating in the Geiger mode is particularly referred to as SPAD. As an example, the voltage VL (first voltage) may be −30 V and the voltage VH (second voltage) may be 1 V. The APD 11 may operate in a linear mode or a Geiger mode. When the APD 11 operates as the SPAD, the potential difference becomes larger than that of the APD 11 in the linear mode, and the effect of the withstand voltage becomes significant. Accordingly, the SPAD is preferable in this case.

The quenching element 2011 is provided between the power supply line for supplying the voltage VH and the cathode of the APD 11. The quenching element 2011 functions as a load circuit (quenching circuit) at the time of signal multiplication by avalanche multiplication, and has a function of suppressing a voltage supplied to the APD 11 and suppressing avalanche multiplication (quenching operation). Further, the quenching element 2011 has a function of returning the voltage supplied to the APD 11 to the voltage VH by flowing a current corresponding to the voltage drop in the quenching operation (recharging operation).

The waveform shaping unit 2012 functions as a signal generation unit that generates a detection pulse based on an output generated by incidence of a photon. That is, the waveform shaping unit 2012 shapes the potential change of the cathode of the APD 11 obtained at the time of photon detection, and outputs a rectangular wave pulse signal (detection pulse). As the waveform shaping unit 2012, for example, an inverter circuit is used. Although FIG. 4 shows an example in which one inverter is used as the waveform shaping unit 2012, a circuit having a plurality of inverters are connected in series may be used. Other circuits having a waveform shaping effect may also be used.

The counter circuit 2013 counts the pulse signals output from the waveform shaping unit 2012 and holds the count value. Further, a control pulse is supplied from the vertical scanning circuit 251 shown in FIG. 3 to the counter circuit 2013 through the driving line 2016. When the control pulse becomes active, the signal held in the counter circuit 2013 is reset.

The selection circuit 2014 includes a switch circuit, a buffer circuit for outputting a signal, and the like. The selection circuit 2014 is supplied with a control pulse from the vertical scanning circuit 251 shown in FIG. 3 through the driving line 2017. In accordance with the control pulse, the selection circuit 2014 electrically switches a connected state or a non-connected state between the counter circuit 2013 and the signal line 219.

A switch such as a transistor may be provided between the quenching element 2011 and the APD 11, and between the APD 11 and the signal processing unit 20. Alternatively, the supply of the voltage VH or the voltage VL may be electrically switched by a switch such as a transistor.

Figure 5A:
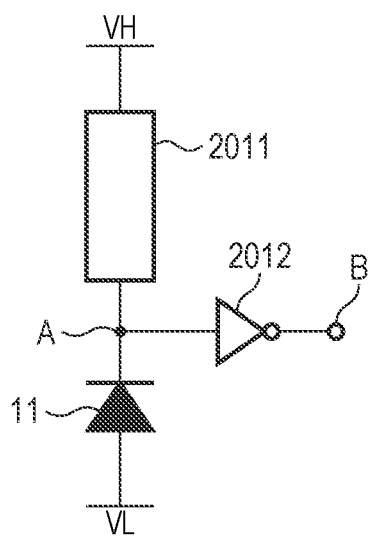
FIGS. 5A, 5B, and 5C are diagrams illustrating the relationship between the operation of the APD and an output signal in the first embodiment.
Figure 5B:
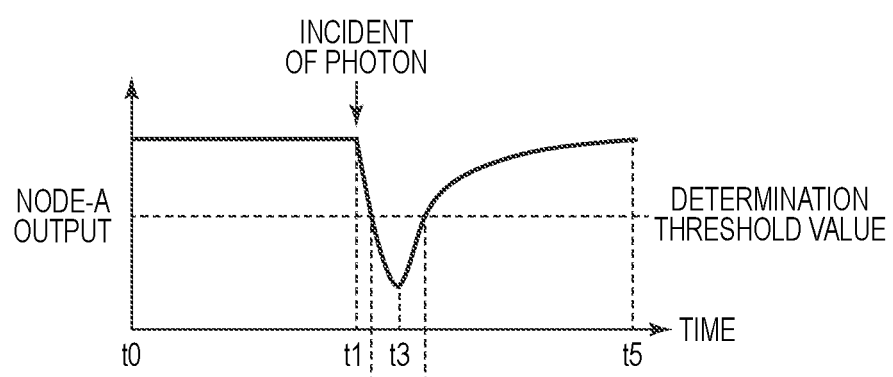
Figure 5C:
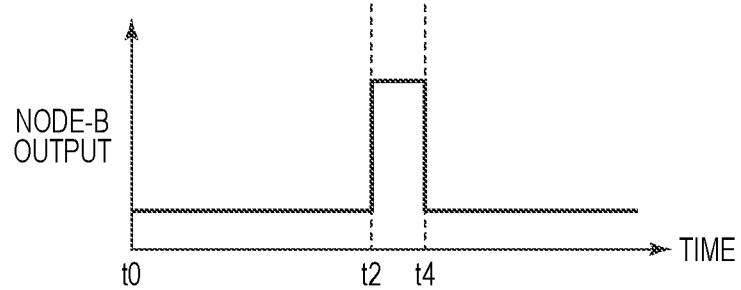

FIGS. 5A, 5B, and 5C are diagrams illustrating the relationship between the operation of the APD and the output signal in the present embodiment. FIG. 5A is a diagram extracted from the APD 11, the quenching element 2011, and the waveform shaping unit 2012 in FIG. 4. When the input side and the output side of the waveform shaping unit 2012 are node A and node B, FIG. 5B illustrates a waveform change of node A and FIG. 5C illustrates a waveform change of node B.

In a period from time t0 to time t1, a reverse bias voltage of VH-VL is applied to the APD 11. When a photon is incident on the APD 11 at the time t1, avalanche multiplication occurs in the APD 11, an avalanche multiplication current flows in the quenching element 2011, and the voltage of node A drops. When the voltage drop further increases and the potential difference applied to the APD 11 decreases, the avalanche multiplication of the APD 11 stops at time t3, and the voltage level of the node A does not drop by a certain constant value or more. After that, in a period from time t3 to time t5, a current that compensates a voltage drop from the voltage VL flows through the node A, and at the time t5, the node A is settled to the original voltage level. At this time, from the time t2 to the time t4, when the voltage level of the node A is lower than the threshold value of the waveform shaping unit 2012, the node B becomes high level. That is, the voltage waveform of node A is shaped by the waveform shaping unit 2012, and a rectangular wave pulse signal is output from node B.

Figure 6:
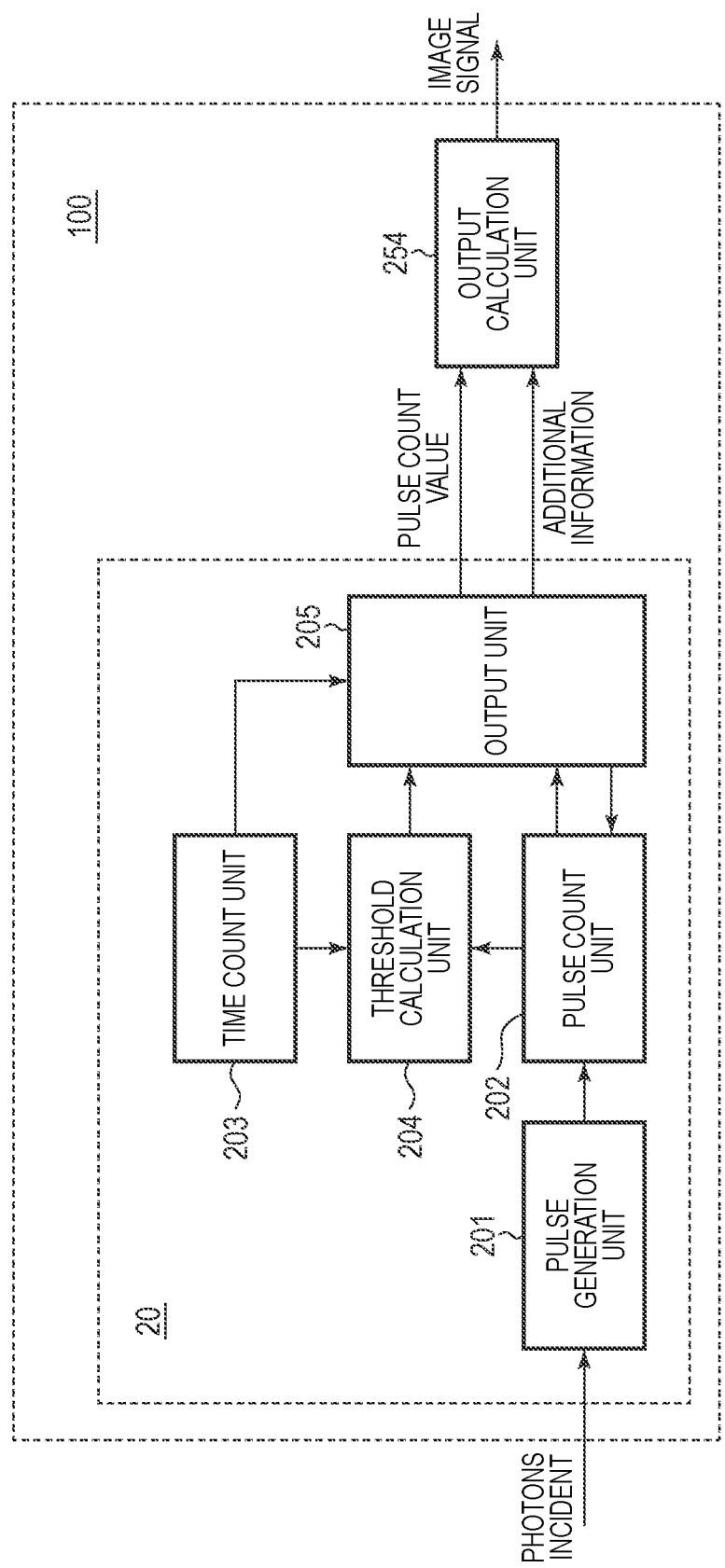
FIG. 6 is a block diagram of the photoelectric conversion device according to the first embodiment.

FIG. 6 is a block diagram of the photoelectric conversion device according to the present embodiment. In FIG. 6, for simplicity of explanation, only the signal processing unit 20 and the output calculation unit 254 of the photoelectric conversion device 100 in FIG. 3 are shown, and the readout circuit 253 and the like between the signal processing unit 20 and the output calculation unit 254 are omitted.

The signal processing unit 20 is provided for each pixel 10, and includes the pulse generation unit 201, a pulse count unit 202, a time count unit 203, a threshold calculation unit 204, and an output unit 205. As described with reference to FIG. 4, the pulse generation unit 201 converts photons incident through the lens into pulse signals.

The pulse count unit 202 counts the pulses generated by the pulse generation unit 201, and outputs a pulse count value. The pulse count unit 202 may be, for example, a flip-flop, and may be a binary counter having a predetermined bit length.

The time count unit 203 measures the time after the pulse count unit 202 counts the pulses, and outputs the measured time as a time count value. The time count value is obtained by counting the clock signal. For example, assume that the cycle of the clock signal is 0.1 microseconds and the time count value is counted up from "0" to "10" (decimal notation). In this case, the time count value indicates that one microsecond has elapsed since the pulse count unit 202 starts counting photons. In order to calculate the change rate (slope) of the pulse count value per unit time, the cycle of the clock signal is preferably sufficiently shorter than the frequency of the incident photons.

The threshold calculation unit 204 calculates a threshold value of the pulse count value for terminating the operations of the pulse generation unit 201 and the pulse count unit 202. The threshold value of the pulse count value is represented by the number of pulses. For example, the threshold calculation unit 204 calculates a change rate (slope) per unit time of the pulse count value based on the pulse count value of the pulse count unit 202 and the time count value of the time count unit 203, and changes the threshold value based on the change rate. Specifically, when the difference between the current change rate and the change rate of the immediately preceding frame is equal to or smaller than a predetermined value, the threshold value is decreased, and when the difference exceeds the predetermined value, the threshold value is increased. The threshold calculation unit 204 includes a memory that holds the change rate of the pulse count value in the immediately preceding frame in order to compare the change rate between the frames.

When the pulse count value is equal to or smaller than the threshold value, the output unit 205 outputs the pulse count value as it is and outputs a unique value as one of the additional information. The unique value is a value indicating that the pulse count value does not exceed the threshold value. The unique value may be any value as long as it can be easily distinguished from the pulse count value, and may be, for example, a value in which all bits of the pulse count value are represented by "1" or "0". Further, a unique value may be assigned to the most significant bit of the pulse count value. When the pulse count value exceeds the threshold value, the pulse count unit 202 stops the pulse count operation, and the output unit 205 outputs time information (time count value) at the time when the pulse count value exceeds the threshold value. At the same time, the output unit 205 outputs the threshold value as one of the additional information.

When the pulse count value exceeds the threshold value, the output calculation unit 254 calculates an estimated value of the actual image signal (pulse count value) based on the time count value included in the additional information and the threshold value, and replaces (extrapolates) the pulse count value from the output unit 205 with the estimated value. On the other hand, when the pulse count value is equal to or smaller than the threshold value, the pulse count value from the output unit 205 is output as an image signal as it is.

Figure 7:
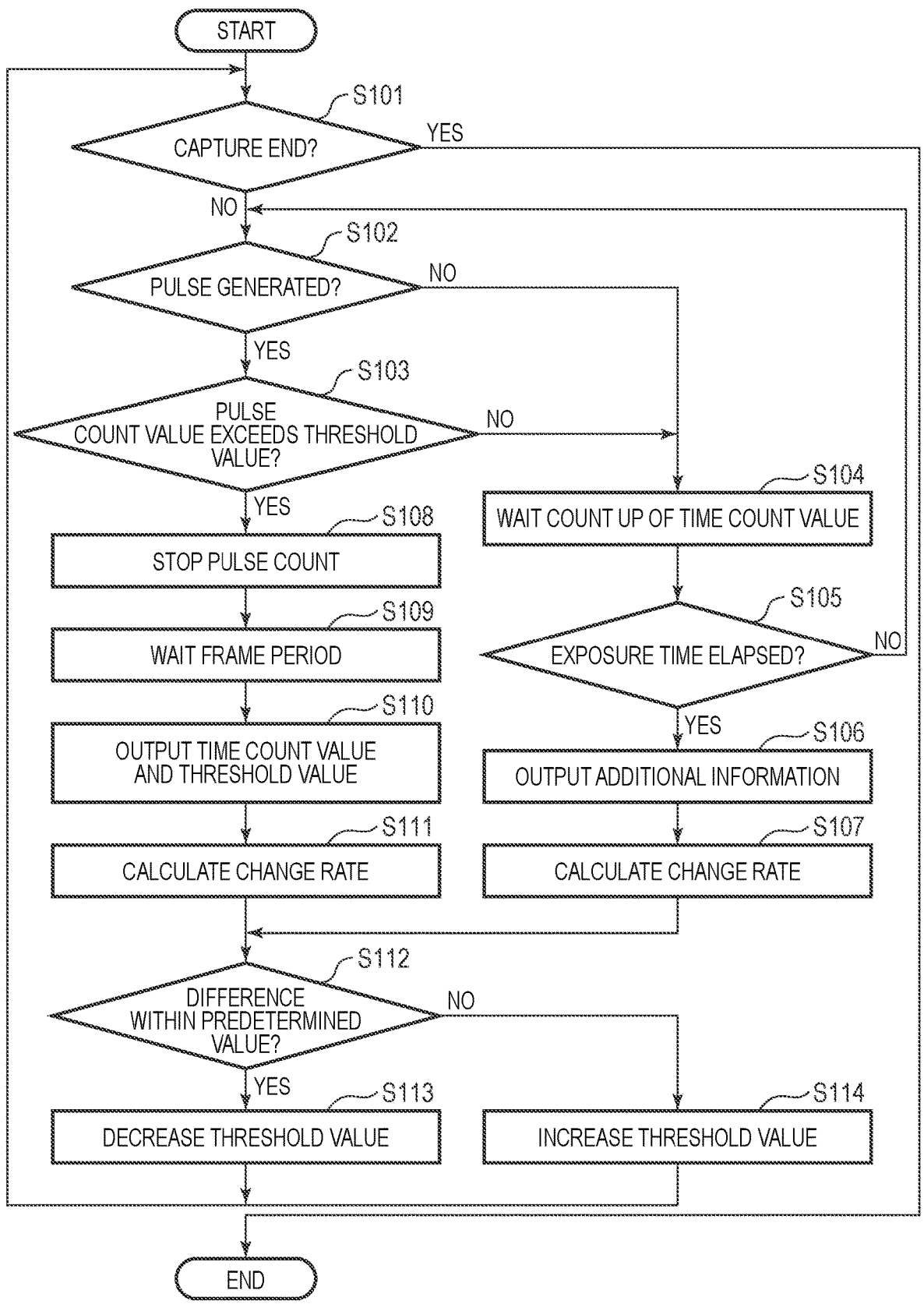
FIG. 7 is a flowchart illustrating the operation of the photoelectric conversion device according to the first embodiment.

FIG. 7 is a flowchart illustrating an operation of the photoelectric conversion device according to the present embodiment, and illustrates processes at the time of capturing a moving image from a generation process of a pulse signal by the pulse generation unit 201 to an output process of an image signal by the output calculation unit 254.

At the same time as the photoelectric conversion device 100 starts the imaging operation, the signal processing unit 20 resets the pulse count value of the pulse count unit 202, and the time count unit 203 starts counting the time count value. The threshold calculation unit 204 sets the threshold value to a predetermined initial value.

In step S101, the photoelectric conversion device 100 determines whether or not an operation of ending a capture of image is performed, and when the operation or instruction of ending the capture is performed (YES in step S101), the photoelectric conversion device 100 stops the imaging. Unless the operation of terminating the imaging is performed (NO in step S101), the photoelectric conversion device 100 repeats the process of steps S102 to S114.

In step S102, when no photon is incident and the pulse generation unit 201 does not generate a pulse (NO in step S102), the signal processing unit 20 transitions to the process of step S104. On the other hand, when a photon is incident and the pulse generation unit 201 generates a pulse (YES in step S102), the pulse generation unit 201 detects the rising edge of the pulse and counts up the pulse count value.

Subsequently, the output unit 205 determines whether or not the pulse count value has exceeded the predetermined threshold value. When the pulse count value does not exceed the threshold value (NO in step S103), or when a pulse due to incident light is not detected (NO in step S102), the output unit 205 waits until the time count value is counted up (step S104). Here, it is assumed that the time count value is counted up by the clock signal, and the cycle of the clock signal is a cycle sufficiently earlier than the occurrence frequency of the pulse count.

In step S105, the output unit 205 determines whether or not the time count value has reached (elapsed) the exposure time of one frame period. When the time count value has not reached the exposure time of one frame period (NO in step S105), the process returns to the step S102. On the other hand, when the time count value has reached the exposure time of one frame period (YES in step S105), the output unit 205 outputs the pulse count value at the current time and the additional information including the unique value indicating that the pulse count value does not exceed the threshold value (step S106).

In step S107, the threshold calculation unit 204 calculates and holds the amount of change per unit time of the pulse count value, that is, the change rate (slope) based on the pulse count value and the time count value corresponding to the pulse count value.

On the other hand, when the pulse count value exceeds the threshold value in the step S103 (YES in step S103), the pulse generation unit 201 and the pulse count unit 202 stop the operation (step S108), and the output unit 205 acquires the current time count value. The photoelectric conversion device 100 may interrupt the current supplied to the APD 11 and stop the operation of the APD 11.

In step S109, the output unit 205 waits until the time count value reaches the exposure time for the frame period. Then, in step S110, the output unit 205 outputs the time count value at the current time and the additional information including the threshold value.

In step S111, the threshold calculation unit 204 calculates and holds the change rate of the pulse count value based on the threshold value and the time count value. The time count value at this time corresponds to a period from the timing when the pulse count value starts counting to the timing when the pulse count value exceeds a threshold value.

In step S112, the threshold calculation unit 204 determines whether or not the difference in the change rate of the pulse count value between the past frame and the current frame is within a predetermined value. When the difference in the change rate of the pulse count value is within the predetermined value (YES in step S112), the threshold calculation unit 204 determines that the scene is a scene with little change, and decreases the threshold value by a predetermined amount (step S113). The predetermined value represents an allowable error of the change rate between frames. The difference in the change rate and the predetermined value can be expressed by absolute values.

In step S112, when the difference in the change rate between the past frame and the current frame is larger than the predetermined value (NO in step S112), the threshold calculation unit 204 increases the threshold value (step S114). The increase amount of the threshold value may be a predetermined value, or the increase amount may be determined based on the current threshold value. Alternatively, the threshold value may be returned to the initial value. Further, at the timing when a certain number of frames have elapsed, the threshold value may be changed and the threshold value may be returned to the initial value. As will be described later, the threshold value may be limited by the upper limit value.

The processes of steps S112, S113, and S114 require a change rate of the pulse count value in the past frames. Therefore, the processes of steps S112, S113, and S114 may not be executed in the process of the first frame at the start of capturing. In steps S105 and S109, the frame period is determined by the frame rate of the moving image to be captured. For example, when the frame rate is 30 fps, the frame period is 1/30 seconds. Also, if a bright scene is expected, a shorter period than the frame period may be used. That is, different periods may be used depending on luminance of the scene to be captured instead of the frame period.

Figure 8:
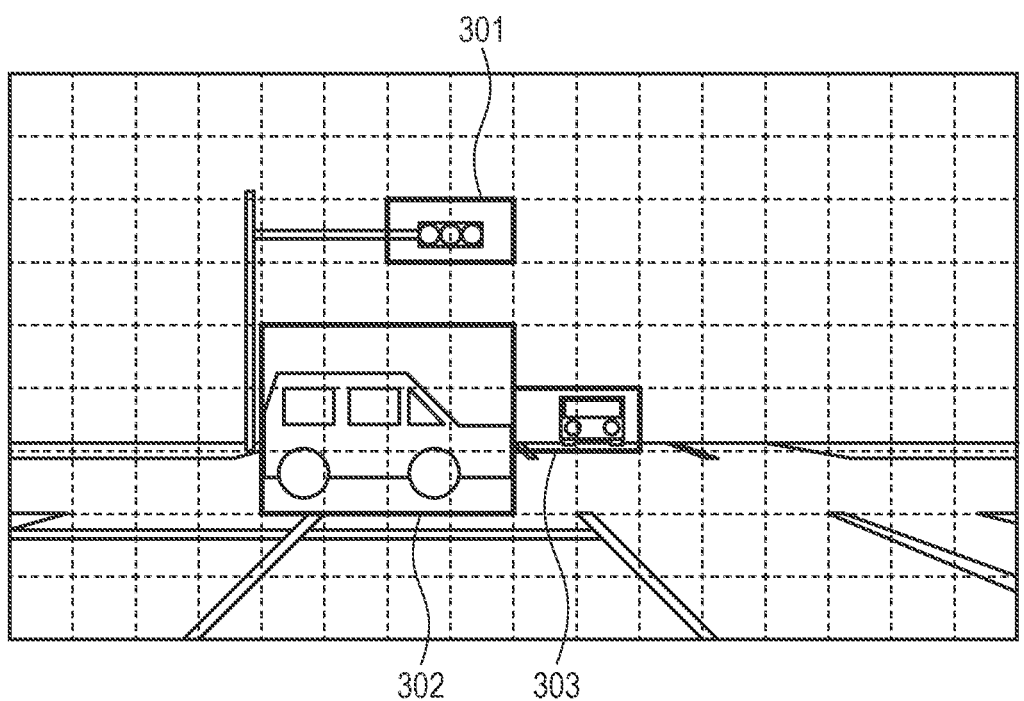
FIG. 8 is an example of a subject for explaining the operation of the photoelectric conversion device according to the first embodiment.
Figure 9:
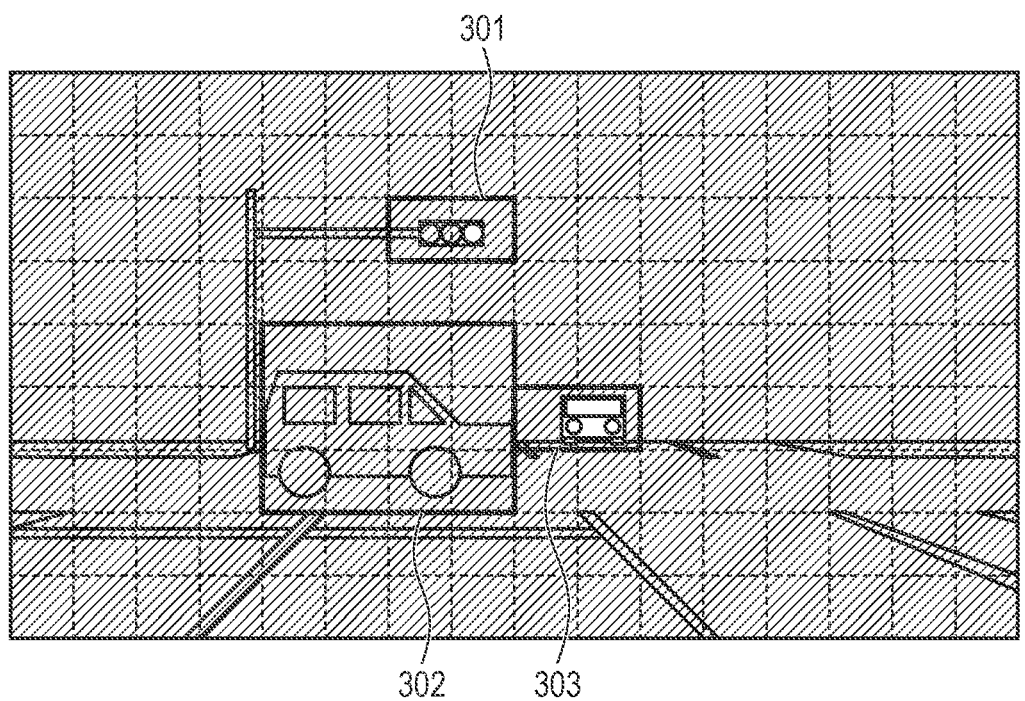
FIG. 9 is another example of a subject for explaining the operation of the photoelectric conversion device according to the first embodiment.

The operation and effect of the present embodiment will be specifically described with reference to FIGS. 8 and 9 as an example. FIG. 8 illustrates a frame of a bright moving image such as a daytime scene. In FIG. 8, a vehicle 302 moves from the left to the right, and another vehicle 303 moves toward the capturing position (camera position) while turning on its headlight. In addition, an LED traffic light 301 is located above the vehicle 302. Since the overall scene shown in FIG. 8 has high luminance, the pulse count value becomes high in most pixels, and power consumption of the conventional image sensor and photoelectric conversion device of the photon counting method becomes larger. FIG. 9 is similar to FIG. 8 except that FIG. 9 represents a frame of a moving image in dark such as night scene. That is, the vehicle 302 moves from the left to the right, and the vehicle 303 moves toward the photographing position while turning on the headlight. In addition, the LED traffic light 301 is located above the vehicle 302. In FIG. 9, the moving vehicle 302 and the vehicle 303 whose headlight is turning on are likely to cause a rapid change in luminance. Therefore, when the imaging operation of the moving image is continued with the threshold being too low, an error of the pulse count value becomes large, and the captured image may differ from the actual scene to be captured. According to the present embodiment, in both scenes shown in FIGS. 8 and 9, the error of the pulse count value can be reduced, and the difference between the image signal and the actual photographing scene can be smaller.

The decrease amount (predetermined amount) of the threshold value per frame may be a fixed value set in advance, and the decrease amount may be determined based on the current threshold value. For example, the higher the current threshold, the larger the amount of decrease in the threshold may be set. When a relatively large change in brightness occurs, such as a change from the scene shown in FIG. 8 to the scene shown in FIG. 9, or when the moving vehicle 302 moves at a high speed, the difference in the change rate becomes large. On the other hand, depending on the scene to be captured, the difference in the change rate may be difficult to appear. When the difference from the threshold value of the past frame is small, the amount of decrease in the threshold value per frame may be smaller in order to reduce the disturbance of the captured image. Further, as described later, a lower limit value of the threshold value may be set so that the threshold value does not fall below the lower limit value.

Further, in step S112, the predetermined value used for comparison with the difference between frames may be a fixed value such as "10" (decimal) or may be determined based on the current threshold value. For example, the higher the current threshold, the higher the predetermined value may be set, or vice versa. The flowchart described above is merely an example, and the order of the processing steps may be changed within a range in which the processing result does not change.

According to the present embodiment, when the difference in the change rate of the pulse count value between frames is small, the threshold value is controlled to be low. The lower the threshold, the higher the effect of reducing power consumption. In addition, when the difference in the change rate is large, since the threshold value is controlled to be high, the difference between the pulse count value and the actual scene can be small.

FIGS. 10A to 10D and 11E to 11G are diagrams for explaining the operation of the photoelectric conversion device according to the present embodiment, and illustrate the relationship between the pulse count value and the threshold value. The horizontal axis represents the exposure time, and the vertical axis represents the pulse count value.

FIGS. 10A to 10D and 11E to 11G illustrate transitions of the pulse count values in a scene having relatively high luminance and little change between a plurality of frames, as in the daytime scene of FIG. 8. In a scene with high luminance and little change between a plurality of frames, the pulse count value is high, and the difference in the change rate of the pulse count value between frames is generally small.

FIGS. 10A to 10D and 11E to 11G show transitions of the pulse count value and the threshold value Th of the first to seventh frames. In the figure, "Th_H" and "Th_L" represent an upper limit value and a lower limit value of the threshold value Th, respectively. The upper limit Th_H and the lower limit Th_L may be set to values other than the most significant bit and the least significant bit. The threshold value Th is clipped by the upper limit Th_H and the lower limit Th_L. The threshold value Th is not necessarily limited to a range between the upper limit Th_H and the lower limit Th_L, and the clipping process is not essential.

Figure 10A:
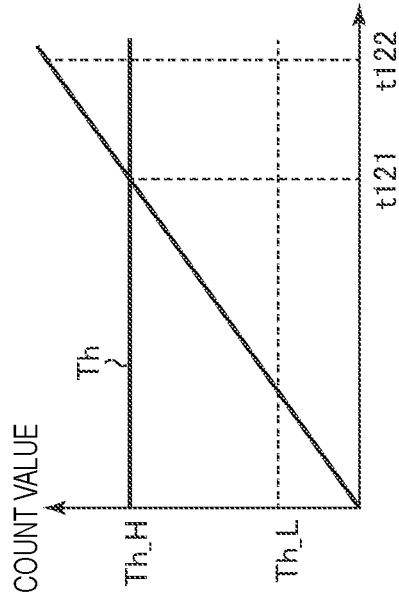
FIGS. 10A, 10B, 10C and 10D are diagrams for explaining the operation of the photoelectric conversion device according to the first embodiment.

At times t111 to t112 of FIG. 10A (first frame), the pulse count value exceeds the threshold value Th, and the pulse generation unit 201 and the pulse count unit 202 stop the operation. In comparison with the case where no threshold value is provided, the exposure time is shortened by the time period t111 to t112. Since pulse counting is not performed after time t111, power consumption in the photoelectric conversion device and the imaging device can be reduced. The output unit 205 outputs the time count value and the threshold value Th as additional information at time t111 when the pulse count value exceeds the threshold value Th. The threshold calculation unit 204 calculates and holds the change rate (slope) of the pulse count value using the time count value at time t111 which exceeds the threshold value Th and the threshold value Th. Based on the change rate, the output calculation unit 254 estimates and outputs the pulse count value after exceeding the threshold value Th. Since the change rate of the past frame is not held in the first frame at the start of capturing, the threshold calculation unit 204 does not determine whether or not to change the threshold value Th.

Figure 10B:
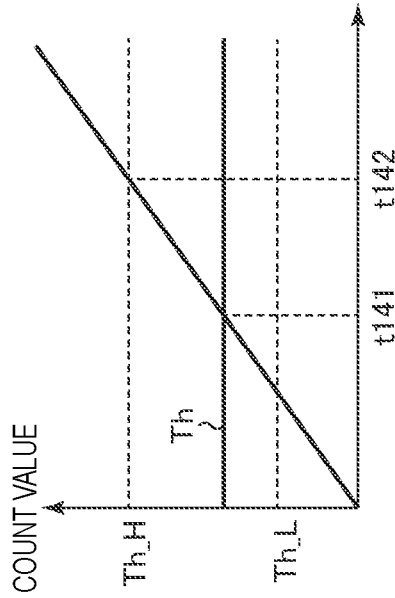

In FIG. 10B (second frame), similarly to the first frame, the output unit 205 outputs the additional information including the time count value and the threshold value Th at time t121 when the pulse count value exceeds the threshold value. Further, the threshold calculation unit 204 calculates the change rate of the pulse count value, and compares the change rate in the first frame with the change rate in the second frame. In a scene with little change, the change rate between frames becomes substantially the same, and the difference in change rate between frames becomes smaller than the predetermined value.

Figure 10C:
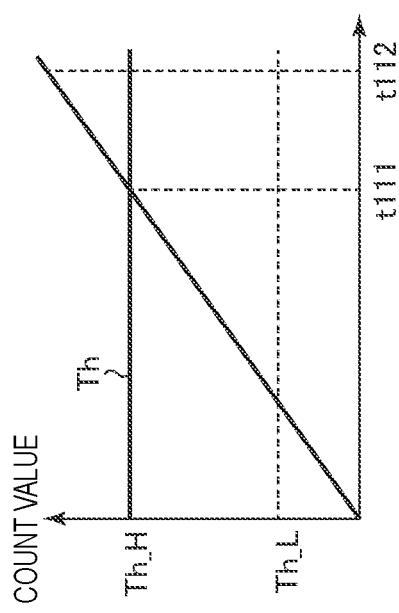

In FIG. 10C (third frame), the threshold calculation unit 204 decreases the threshold value Th based on the determination result in the second frame. When the threshold value Th decreases, the exposure time is further shortened by the period t131 to t142. That is, since pulse counting is not performed in the period t131 to t142, power consumption in the photoelectric conversion device and the imaging device can be reduced as compared with the case where the fixed threshold value Th is used.

Figure 10D:
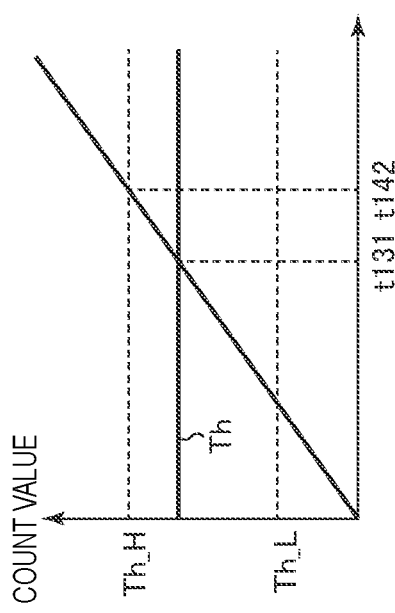

In FIGS. 10D (fourth frame) and 11E (fifth frame), since the difference in the change rate between frames is small, the threshold calculation unit 204 further decreases the threshold value Th. In the fourth frame, the exposure time is shortened by the period t141 to t142. In the fifth frame, the threshold value Th decreases to the lower limit Th_L, and the exposure time is further shortened by the period t151 to t152. As described above, the effect of reducing the power consumption increases as the threshold value Th decreases.

In FIG. 11F (sixth frame), the threshold value Th maintains the lower limit Th_L. Also in the sixth frame, the exposure time is shortened by the period t161 to t162, and the power consumption is reduced.

As shown in FIGS. 11E and 11F, when the threshold value Th continues to be equal to the lower limit Th_L, the difference between the captured image and the actual scene may large. Therefore, when the number of frames whose threshold value Th is the lower limit value Th_L reaches a predetermined number, for example, in FIG. 11G (the seventh frame), the threshold calculation unit 204 increases the threshold value Th to lengthen the pulse count time. According to the method, the difference between the captured image and the actual scene can be small. Also in this case, the pulse counting stops after time t171, and the effect of reducing the current consumption can be obtained.

FIGS. 12A to 12O are diagrams for explaining the operation of the photoelectric conversion device according to the present embodiment, and illustrate operation examples in the case where there is a rapid change in the high-speed movement or the luminance of the subject.

FIGS. 12A to 12O illustrate the relationship between the pulse count value and the threshold value Th in each of the first to fifteenth frames. The horizontal axis represents the exposure time, and the vertical axis represents the pulse count value. A graph of the pulse count value after the threshold value Th is exceeded indicates the number of photons actually incident. After the pulse count value exceeds the threshold value Th, the pulse count is actually stopped, and replacement with the estimated value is performed.

FIGS. 12A to 12E (first to fifth frames) illustrate the pulse count values and the threshold value Th when luminance is low. FIGS. 12F to 12J (sixth to tenth frames) illustrate the pulse count value and the threshold value Th when luminance changes rapidly from a low state to a high state. FIGS. 12K to 12O (11 to 15th frames) illustrate the pulse count value and the threshold value Th when a high luminance state continues.

In FIGS. 12A to 12E (first to fifth frames), since the difference in the change rate of the pulse count value is small, the threshold value Th gradually decreases from the upper limit Th_H for each frame. For example, the difference between the change rate of the pulse count value in FIG. 12A (first frame) and the change rate in FIG. 12B (second frame) is substantially zero, and the threshold value in FIG. 12C (third frame) becomes lower by a predetermined amount. In FIG. 12E (fifth frame), the threshold value Th decreases to the lower limit Th_L. In FIGS. 12A to 12E (first to fifth frames), since the luminance is low, the pulse count value does not exceed the threshold value Th.

In FIG. 12F (sixth frame) and FIG. 12G (seventh frame), although the difference in the change rate of the pulse count value is small, since the threshold value Th reaches the lower limit value Th_L, the process of reducing the threshold value Th is not performed. In FIG. 12H (the eighth frame), the change rate A08 in the eighth frame is larger than the change rate A07 in the seventh frame, and a difference occurs between the change rates A07 and A08. However, since the difference between the change rates A07 and A08 is smaller than the predetermined value, the threshold value Th is maintained at the lower limit Th_L.

In FIG. 12I (9th frame), the difference between the change rate A08 of the eighth frame and the change rate A09 of the ninth frame exceeds the predetermined value. Therefore, in FIG. 12J (10th frame), the threshold value Th becomes higher than the upper limit Th_H. Based on the change rate A09, the output calculation unit estimates and outputs the pulse count value after exceeding the threshold value. In the figure, the pulse count value after exceeding the threshold value Th represents the number of actually incident photons, and the pulse count value after exceeding the threshold value Th is represented as a graph of the change rate A09. In FIG. 12J (10th frame), the difference between the change rate A09 of FIG. 12I (9th frame) and the change rate A10 of FIG. 12J (10th frame) exceeds the predetermined value. However, since the threshold value Th is the upper limit Th_H, the process of increasing the threshold value Th is not performed.

In FIG. 12K (the eleventh frame), a high-luminance subject is captured, and the difference between the change rate A10 of FIG. 12J (the tenth frame) and the change rate A11 of FIG. 12K (the eleventh frame) exceeds the predetermined value. However, since the threshold value Th is the upper limit Th_H, the threshold value Th is maintained at the upper limit Th_H.

In FIGS. 12L to 12O (the twelfth to fifteenth frames), a high-luminance subject is captured, but there is little change in luminance. Therefore, the difference in the change rate between frames becomes small, and the threshold value Th gradually decreases toward the lower limit Th_L.

FIG. 13A to 13O are diagrams for explaining the operation of the photoelectric conversion device according to the present embodiment, and illustrate another operation example in the case where a high-speed movement of the subject or a rapid change in luminance occurs.

FIGS. 13A to 13O illustrate the relationship between the pulse count value and the threshold value Th in each of the first to fifteenth frames. The horizontal axis represents the exposure time, and the vertical axis represents the pulse count value. Note that, after the pulse count value exceeds the threshold value Th, the count operation is actually stopped, and replacement with the estimated value is performed, however, FIGS. 13A to 13O illustrate the number of photons actually incident for reference.

In FIGS. 13A to 13E (first to fifth frames), the high luminance state continues, and the threshold value Th gradually decreases from the upper limit Th_H to the lower limit Th_L for each frame. In FIGS. 13F to 13J (6th to 10th frames), the luminance slowly decreases. In FIG. 13G (the seventh frame), the difference between the change rate A06 of the sixth frame and the change rate A07 of the seventh frame exceeds the predetermined value, and the threshold value Th in FIG. 13H (the eighth frame) increases to the upper limit value Th_H. In FIGS. 13I to 13O (9th to 15th frames), the low luminance state continues. Since the difference from the change rate of the previous frames becomes small, the threshold value Th gradually decreases toward the lower limit Th_L. Although the threshold value Th is not lower than the lower limit Th_L, the pulse count value does not exceed the threshold value Th in a low luminance state.

As described above, in the present embodiment, when the pulse count value exceeds the threshold value, the pulse count is stopped. Thus, the current consumption of the photoelectric conversion device can be reduced. Further, by using the time count value and the threshold value at the time when the pulse count value exceeds the threshold value, it is possible to more accurately estimate the pulse count value after exceeding the threshold value, and an image signal with less error can be output. Therefore, according to the present embodiment, it is possible to reduce the current consumption while reducing the error of the image signal.

Further, the difference between the image signal and the actual scene can be small by changing the threshold value based on the difference in the change rate of the pulse count value between frames.

Second Embodiment

Next, a photoelectric conversion device according to the present embodiment will be described. The photoelectric conversion device of the present embodiment is different from the photoelectric conversion device of the first embodiment in that process in a sub-frame is performed. Hereinafter, a configuration and operation different from those of the first embodiment will be mainly described. The same components as those in the first embodiment are denoted by the same reference numerals, and description thereof may be omitted.

In the present embodiment, the pulse count value and the threshold value Th are compared for each sub-frame. Hereinafter, the operation and effects of the present embodiment will be described in detail.

FIGS. 14A and 14B are diagrams for explaining the operation of the photoelectric conversion device according to the present embodiment, and illustrate pulse count values in a scene in which a change in luminance is small. A graph of the pulse count value after exceeding the threshold value Th indicates the number of photons actually incident. After the pulse count value exceeds the threshold value Th, the pulse count is actually stopped, and replacement with the estimated value is performed.

FIG. 14A illustrates a pulse count value of one frame, and FIG. 14B illustrates a pulse count value of a plurality of sub-frames obtained by dividing one frame. In FIGS. 14A and 14B, the horizontal axis represents the exposure time and the vertical axis represents the pulse count value. One frame in FIG. 14A is divided into a plurality of sub-frames T1 to T5 adjacent with each other in time domain as shown in FIG. 14B, and pulse counting is performed in each of the sub-frames T1 to T5. The pulse count values of the sub-frames T1 to T5 are combined, and the combined data is output as an image signal of one frame. Further, the pulse count value and the threshold value Th are compared in each of the sub-frames T1 to T5. The number of sub-frames divided in one frame is not limited to the above example, and may be any number of two or more. In FIG. 14A, the pulse count value starts to increase simultaneously with the start of the frame, and the pulse count value exceeds the threshold value Th at time t201. The pulse count value in the period t201 to t202 that exceeds the threshold value Th can be estimated by the output calculation unit 254 (FIG. 6). In FIG. 14A, although the estimated value of the pulse count value in the relatively long period t201 to t202 are calculated, the difference between the captured image and the actual scene is small because the luminance change is small.

In FIG. 14B, the pulse count value starts to increase simultaneously with the start of the sub-frame T1, and the pulse count value exceeds the threshold value Th at time t211. The pulse count value at times t211 to t212 that exceeds the threshold value Th is estimated by the output calculation unit 254. Similarly, the pulse count value is counted in each of the sub-frames T1 to T5, and comparison with the threshold value Th and estimation of the pulse count value are performed. In the sub-frames T1 to T5, a period between the times t211 to t212 at which the pulse count value exceeds the threshold value Th is relatively short. The sum of the times t211 to t212 of the sub-frames T1 to T5 is shorter than the times t201 to t202 of one frame. Therefore, in the present embodiment, the period during which the pulse count value is estimated is shortened, and the difference between the image signal and the actual scene can be small. However, in a scene in which the change in luminance is small, the difference between FIGS. 14A and 14B may be small.

Although not shown in FIGS. 14A and 14B, the upper limit Th_H and the lower limit Th_L of the threshold value Th may also be set in the present embodiment. Since the threshold value Th falls within the range of the upper limit Th_H and the lower limit Th_L, an effect of reducing an error in the estimated value of the pulse count value can be obtained.

Figure 15A:
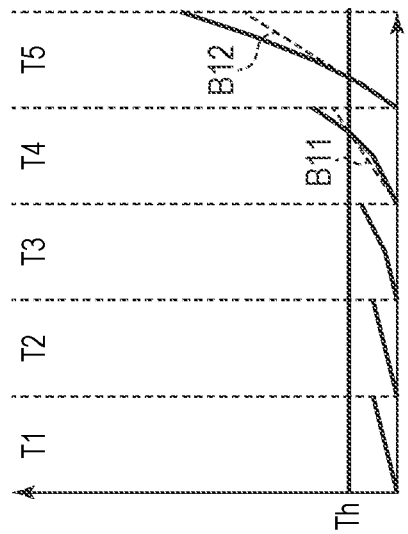
FIGS. 15A and 15B are diagrams for explaining the operation of the photoelectric conversion device according to the second embodiment.
Figure 15B:
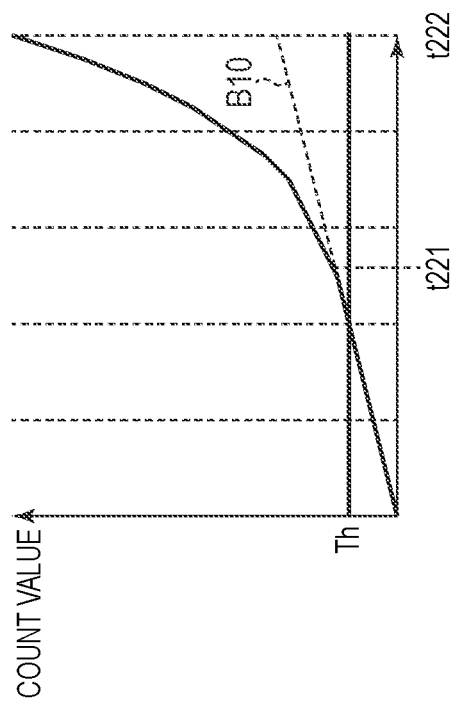

FIGS. 15A and 15B are diagrams for explaining the operation of the photoelectric conversion device according to the present embodiment, and illustrate pulse count values in a scene in which the luminance gradually changes and then rapidly increases. A graph of the pulse count value after exceeding the threshold value Th indicates the number of photons actually incident. After the pulse count value exceeds the threshold value Th, the pulse count is actually stopped, and replacement with the estimated value is performed.

In FIG. 15A, the pulse count value starts to increase at the same time as the start of the frame, the pulse count value exceeds the threshold value Th at time t221, and the pulse count is stopped after time t221. The pulse count value after time t221 is output as an estimated value B10. The actual luminance value rapidly rises after time t221. Therefore, in the period t221 to t222 after exceeding the threshold value Th, the estimated value B10 of the pulse count value is largely different from the actual luminance value, and the difference between the captured image and the actual scene becomes large.

In FIG. 15B, the pulse count value increases at the same time as the start of the sub-frame T1, and the pulse count value is reset at the end of the sub-frame T1. Then, the count up and the reset of the pulse count value are repeated in each of the sub-frames T2 to T5. In the sub-frame T4, the pulse count value exceeds the threshold value Th, and the estimated value B11 of the pulse count value after exceeding the threshold value Th approximates the actual luminance value. Also in the sub-frame T5, the pulse count value exceeds the threshold value Th, but the estimated value B12 of the pulse count value after the threshold value Th is approximated to the actual luminance value. The pulse count values of the sub-frames T1 to T5 are combined and output as an image signal of one frame. According to the present embodiment, by dividing one frame into a plurality of sub-frames T1 to T5, the error of the estimated value after the pulse count value exceeds the threshold value Th can be reduced. This makes it possible to reduce the difference between the image signal and the actual scene.

Figure 16A:
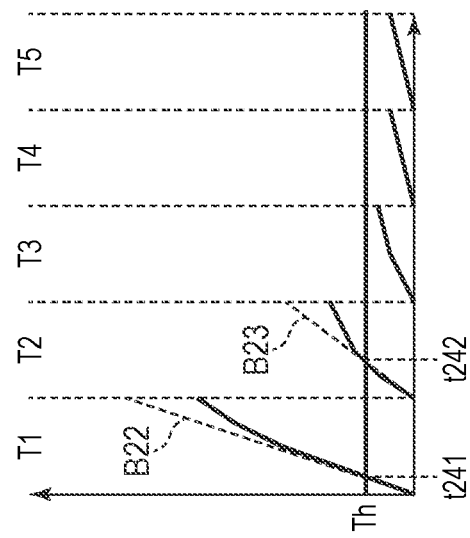
FIGS. 16A and 16B are diagrams for explaining the operation of the photoelectric conversion device according to the second embodiment.
Figure 16B:
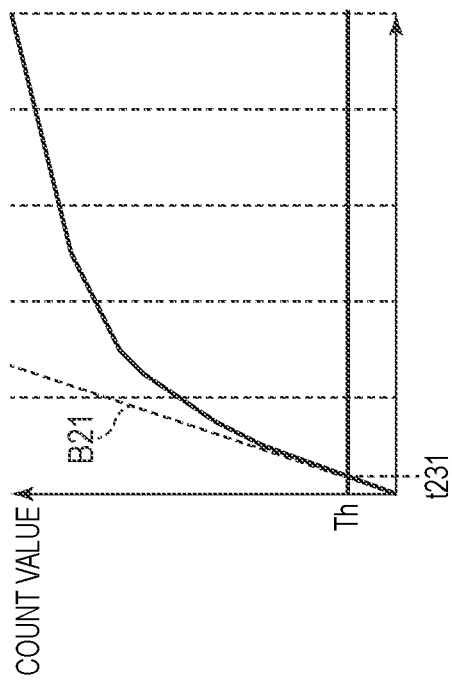

FIGS. 16A and 16B are diagrams for explaining the operation of the photoelectric conversion device according to the present embodiment, and illustrate pulse count value in a scene in which the luminance gradually changes after a rapid increase in luminance. A graph of the pulse count value after exceeding the threshold value Th indicates the number of photons actually incident. After the pulse count value exceeds the threshold value Th, the pulse count is actually stopped, and replacement with the estimated value is performed.

In FIG. 16A, the pulse count value starts to increase simultaneously with the start of the frame, and the pulse count value exceeds the threshold value Th at time t231. After time t231, the estimated value B21 of the pulse count value is largely different from the actual luminance value, and the difference between the image signal and the actual scene becomes large.

In FIG. 16B, the pulse count value increases simultaneously with the start of the sub-frame T1, and exceeds the threshold value Th at time t241. After exceeding the threshold value Th, the estimated value B22 of the pulse count value is calculated. The pulse count value is reset by the end of the sub-frame T1. At the same time as the start of the sub-frame T2, the pulse count value increases and exceeds the threshold value Th at time t242. After exceeding the threshold value Th, the estimated value B23 of the pulse count value is calculated. In the sub-frames T3 to T5, since the pulse count value does not exceed the threshold value Th, the estimated value is not calculated. The pulse count values of the sub-frames T1 to T5 are combined and output as an image of one frame. Also in FIG. 16B, an error of the estimated values B22 and B23 is smaller than the error of the estimated value B21 in FIG. 16A, and it is possible to reduce the difference between the image signal and the actual scene.

As described above, according to the present embodiment, one frame is divided into a plurality of sub-frames, the pulse count value is compared with the threshold value in each sub-frame, and the pulse count value is estimated, thereby an error in an image signal can be reduced. Further, in the present embodiment, since one frame is divided into a plurality of sub-frames, the above-described effects can be obtained not only in a moving image but also in a still image to be captured.

Next, an operation of changing the threshold value Th in a plurality of sub-frames will be described with reference to FIGS. 17A to 17C and FIGS. 18A to 18C. Also in the present embodiment, the effect of reducing power consumption can be increased when the subject moves at high speed or the luminance rapidly changes. Further, by dividing one frame into a plurality of sub-frames, it is possible to reduce the difference between the captured image and the actual scene.

FIGS. 17A to 17C are diagrams for explaining the operation of the photoelectric conversion device according to the present embodiment, and explaining a change in the threshold value Th in a plurality of sub-frames. In FIGS. 17A, 17B, and 17C, the upper graph represents the pulse count value in one frame, and the lower graph represents the pulse count value, the change rate, and the threshold value Th in a plurality of sub-frames. FIGS. 17A, 17B, and 17C correspond to the first to third frames, respectively.

In FIG. 17A (first frame), the luminance is low and change in the luminance is small. In the sub-frame T1, the threshold value Th is set to the upper limit Th_H as the initial value. In the sub-frame T2, the difference between the change rate of the pulse count value of the sub-frame T1 and the change rate of the pulse count value of the sub-frame T2 is equal to or smaller than the predetermined value. Therefore, the threshold calculation unit 204 (FIG. 6) decreases the threshold value Th for the next sub-frame T3. Similarly, in the sub-frames T3 to T5, the threshold value Th gradually decreases, and in the sub-frame T5, the threshold value Th becomes the lower limit Th_L. Since the pulse count value does not exceed the threshold value Th in the sub-frames T1 to T5, the pulse count value estimation processing is not performed.

In FIG. 17B (second frame), the luminance rapidly increases. In the sub-frames T1 to T2, the change rate of the pulse count value is small and the pulse count value is equal to or less than the threshold value Th. Therefore, the threshold value Th maintains the lower limit Th_L. Since the difference between the change rate A22 in the sub-frame T2 and the change rate A23 in the sub-frame T3 is equal to or smaller than the predetermined value, the threshold value Th in the sub-frame T4 maintains the lower limit Th_L. In the sub-frame T4, the pulse count value rapidly increases, and the change rate A24 also increases. The difference between the change rate A23 in the sub-frame T3 and the change rate A24 in the sub-frame T4 exceeds the predetermined value, and the threshold value Th in the sub-frame T5 becomes the upper limit value Th_H. In the sub-frame T4, the estimated value of the pulse count value after exceeding the threshold value Th is calculated. In the sub-frame T5, the luminance value continues to increase, and the difference between the change rate A24 in the sub-frame T4 and the change rate A25 in the sub-frame T5 exceeds the predetermined value. At this time, since the threshold value Th has already been the upper limit Th_H, the threshold value Th does not change. In the sub-frame T5, the estimated value of the pulse count value after exceeding the threshold value Th is calculated.

In the third frame shown in FIG. 17C, the luminance is high. In the sub-frame T1, the pulse count value increases at a constant change rate A31. Therefore, the graph of the pulse count value (luminance value) and the graph of the change rate A31 are shown overlapping each other. The difference between the change rate A31 in the sub-frame T1 of the third frame and the change rate A25 in the sub-frame T5 of the second frame exceeds the predetermined value. However, since the threshold value Th is the upper limit Th_H, the threshold value Th does not change. Since the change rate of the pulse count value is constant in the sub-frames T2 to T5, the threshold value Th gradually decreases, and in the sub-frame T5, the threshold value Th becomes the lower limit Th_L. Further, in the sub-frames T1 to T5, the estimated value of the pulse count value after exceeding the threshold value Th is calculated.

FIGS. 18A to 18C are diagrams for explaining the operation of the photoelectric conversion device according to the present embodiment, and illustrate an example of a luminance change opposite to the luminance change in FIGS. 17A to 17C. As in FIGS. 17A to 17C, in FIGS. 18A to 18C, the upper graph represents the pulse count value in one frame, and the lower graph represents the pulse count value, the change rate, and the threshold value Th in a plurality of sub-frames. FIGS. 18A, 18B, and 18C correspond to the first to third frames, respectively.

In the first frame shown in FIG. 18A, the luminance is high. In the sub-frames T1 to T5, the pulse count value increases at a constant change rate. Therefore, the difference in the change rate of the pulse count value becomes constant, the threshold value Th gradually decreases, and the threshold value Th becomes the lower limit value Th L in the sub-frame T5. Further, in the sub-frames T1 to T5, the estimated value of the pulse count value after exceeding the threshold value Th is calculated.

In the second frame shown in FIG. 18B, the luminance rapidly increases and then gradually changes. The change rate A21 in the sub-frame T1 coincides with the change rate A15 in the sub-frame T5 of the first frame, and the threshold value Th maintains the lower limit Th_L. The difference between the change rate A21 in the sub-frame T1 and the change rate A22 in the sub-frame T2 exceeds the predetermined value, and the threshold value Th in the sub-frame T3 becomes the upper limit value Th_H. The difference between the change rate A22 and the change rate A23 also exceeds the predetermined value, and the threshold value Th in the sub-frame T4 maintains the upper limit Th_H. In the sub-frame T4, the difference between the change rate A23 and the change rate A24 becomes equal to or less than the predetermined value, and the threshold value Th in the sub-frame T5 becomes low.

In the third frame shown in FIG. 18C, the luminance is low and change in the luminance is small. In the sub-frames T1 to T5, the difference in the change rate of the pulse count value is substantially constant and equal to or smaller than the predetermined value. Therefore, the threshold value Th decreases, and in the sub-frames T2 to T5, the threshold value Th becomes the lower limit Th_L. Since the pulse count value does not exceed the threshold value Th in the sub-frames T1 to T5, the pulse count value estimation processing is not performed.

As described above, according to the present embodiment, one frame is divided into sub-frames, and the pulse count value and the threshold value Th are compared for each sub-frame. Therefore, an error of the estimated value of the pulse count value when the threshold value is exceeded can be reduced. That is, when the threshold value is exceeded, the difference between the actual scene and the captured image can be reduced.

Also in the present embodiment, when the pulse count value exceeds the threshold value, the pulse count is stopped and the current consumption of the photoelectric conversion device can be reduced. Further, based on the time count and the threshold value at the time when the pulse count value exceeds the threshold value, it is possible to more accurately estimate the pulse count value after the threshold value is exceeded, and output an image signal with less error. Therefore, the current consumption can be reduced while the error of the image signal is reduced.

Third Embodiment

Next, a photoelectric conversion device according to the present embodiment will be described. In the present embodiment, some of the circuits are shared by the plurality of signal processing units 20. Hereinafter, the present embodiment will be described focusing on the configuration and operation different from the first and second embodiments.

Figure 19:
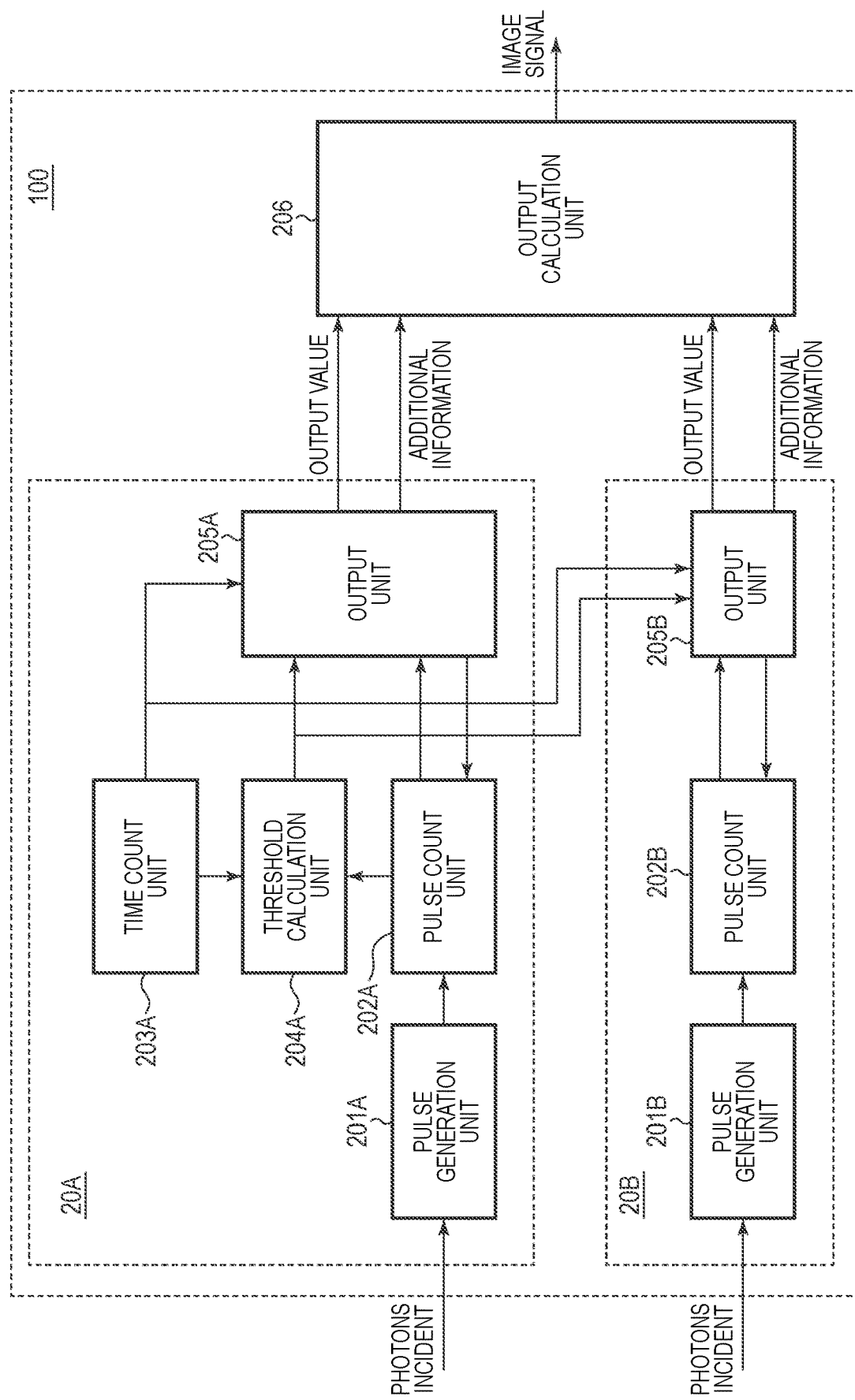
FIG. 19 is a block diagram of a photoelectric conversion device according to a third embodiment.

FIG. 19 is a block diagram of a photoelectric conversion device according to the present embodiment. In FIG. 19, for simplicity of explanation, only the two signal processing units 20A and 20B and the output calculation unit 254 of the photoelectric conversion device 100 in FIG. 3 are shown, and the other components are omitted. The signal processing unit 20A includes a pulse generation unit 201A, a pulse count unit 202A, a time count unit 203A, a threshold calculation unit 204A, and an output unit 205A. The signal processing unit 20B includes a pulse generation unit 201B, a pulse count unit 202B, and an output unit 205B, but the signal processing unit 20B does not include a time count unit and a threshold calculation unit.

The time count value from the time count unit 203A and the threshold value Th from the threshold calculation unit 204A are input to the output unit 205A of the signal processing unit 20A and the output unit 205B of the signal processing unit 20B, respectively. That is, the signal processing units 20A and 20B operate based on the common time count value and the threshold value Th.

In the first embodiment shown in FIG. 6, since the time count unit 203 and the threshold calculation unit 204 are provided for each of the signal processing units 20, the area of each pixel circuit increases and the integration degree decreases. According to the present embodiment, since a part of the circuits in the plurality of signal processing units 20 is shared, the circuit scale can be reduced.

Figure 20:
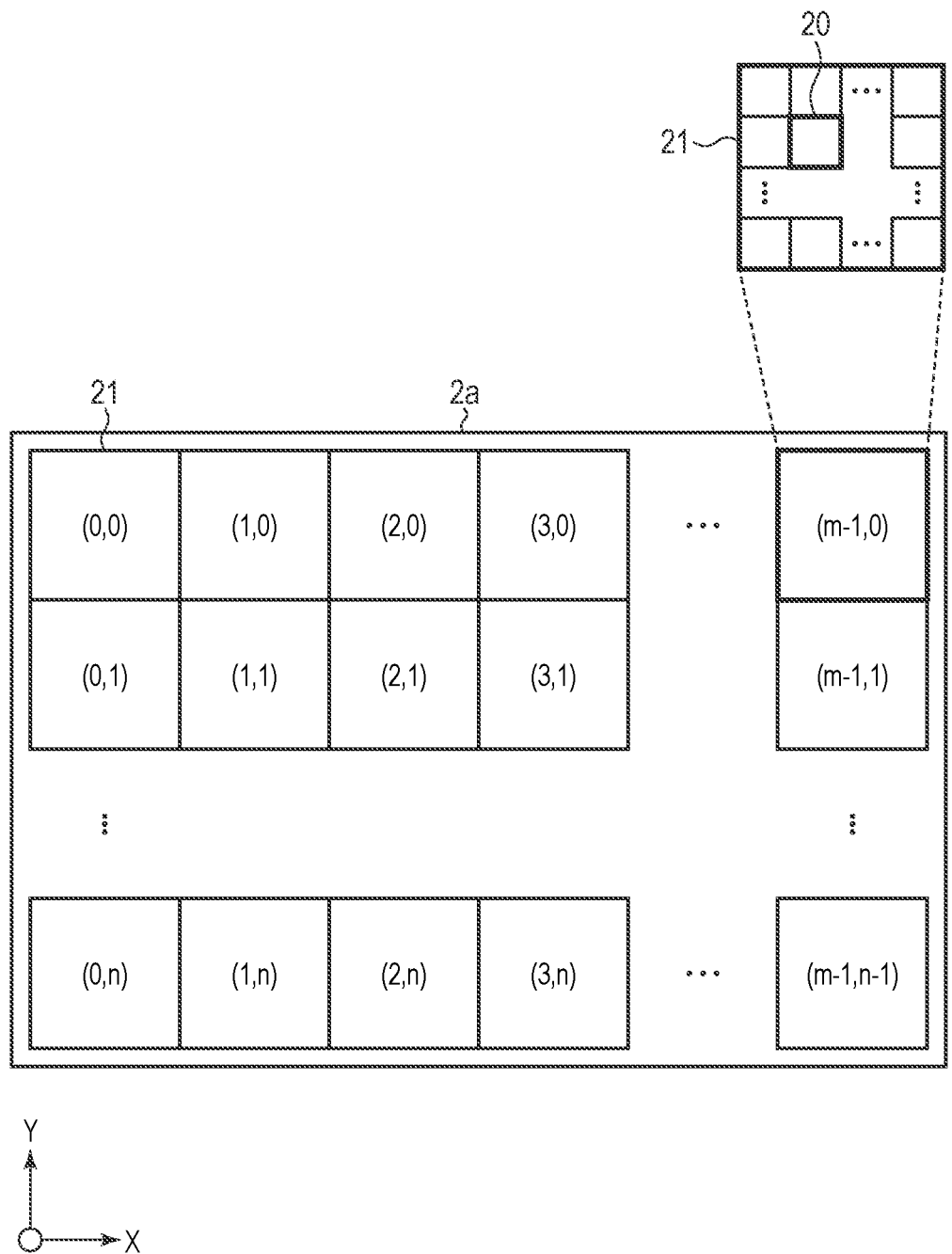
FIG. 20 is a diagram illustrating a configuration example of a pixel block according to the third embodiment.

FIG. 20 is a diagram illustrating a configuration example of a pixel block according to the present embodiment. The circuit region 2a is divided into a plurality of (m×n) pixel blocks 21. For example, when 1600 pixels are arranged in the X direction and 900 pixels are arranged in the Y direction, (20×10) pixel blocks 21 may be provided. In this case, one pixel block 21 includes, for example, (100×100) signal processing units 20. The time count unit 203 and the threshold calculation unit 204 are provided for each pixel block 21. That is, one pixel block 21 comprises one signal processing unit 20A including a time count unit 203 and a threshold calculation unit 204, and a plurality of signal processing units 20B not including the time count unit 203 and the threshold calculation unit 204. The plurality of pixel blocks 21 are arranged, for example, in a region indicated by a dotted line in FIGS. 8 and 9, and a threshold value calculation and a pulse count value estimation are performed for each pixel block 21.

The number of pixel blocks 21 and the number of pixels in the X direction and the Y direction are not limited to the above example. The shape and aspect ratio of the signal processing unit (pixel) 20 are not limited, and may be rectangular instead of square. Further, the pixel block 21 may include only one signal processing unit 20.

As described above, according to the present embodiment, since a part of the circuits is shared by a plurality of signal processing units, the circuit scale can be reduced.

Fourth Embodiment

Next, a photoelectric conversion device according to the present embodiment will be described. Hereinafter, the present embodiment will be described focusing on the configuration and operation different from the first and second embodiments.

Figure 21:
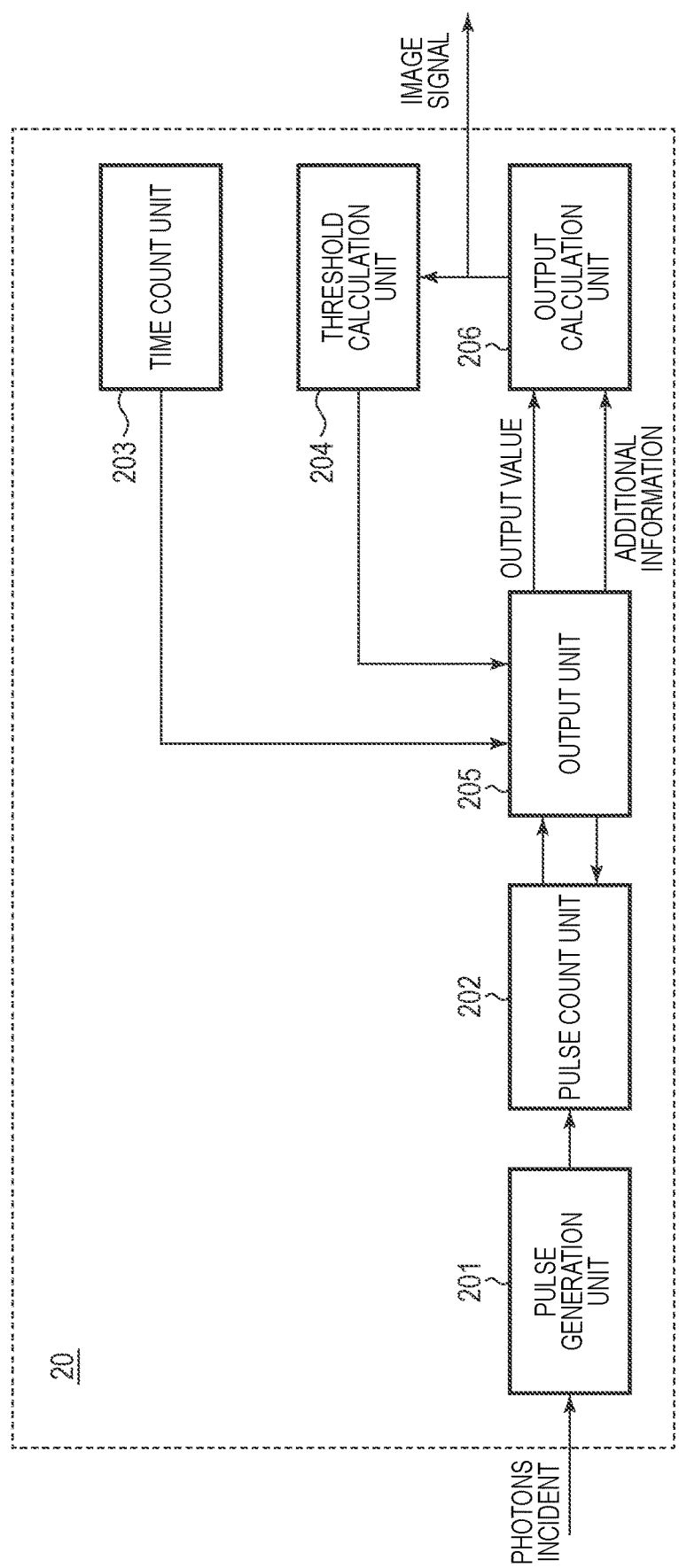
FIG. 21 is a block diagram of a photoelectric conversion device according to a fourth embodiment.

FIG. 21 is a block diagram of the photoelectric conversion device according to the present embodiment, and illustrates the configuration of the signal processing unit 20. The signal processing unit 20 includes a pulse generation unit 201, a pulse count unit 202, a time count unit 203, a threshold calculation unit 204, an output unit 205, and an output calculation unit 206. The pulse generation unit 201, the pulse count unit 202, the time count unit 203, and the output unit 205 are configured in substantially the same manner as in the above-described embodiments. In the present embodiment, unlike the above-described embodiments, the pixel value from the output calculation unit 206 is input to the threshold calculation unit 204, and the threshold calculation unit 204 holds the past pixel value instead of the change rate of the past pulse count value. The immediately preceding pixel value is held in the threshold calculation unit 204. Here, the pixel value is a pulse count value when the pulse count value does not exceed the threshold value or an estimated value of the pulse count value after the pulse count value exceeds the threshold value.

The operation of the photoelectric conversion device of this embodiment is different from that of the above-described embodiment in the following points of the flowchart of FIG. 7. In steps S107 and S111, pixel values are held instead of the change rate. In step S112, the output calculation unit 254 determines whether or not the difference between the pixel values is within the predetermined value. When the difference in pixel value between frames is within the predetermined value (YES in step S112), the threshold value is decreased (step S113). On the other hand, when the difference in pixel values between frames exceeds the predetermined value (NO in step S112), the threshold is increased (step S114).

According to the present embodiment, the threshold calculation unit 204 does not need to calculate the change rate of the pulse count value, and it is possible to determine the change of the threshold value based on the difference or ratio between the current pixel value and the immediately preceding pixel value. Therefore, the number of circuits for calculating the change rate can be reduced, and the circuit scale can be reduced.

Fifth Embodiment

Next, a photoelectric conversion device according to the present embodiment will be described. Hereinafter, the present embodiment will be described focusing on a configuration and operation different from those of the fourth embodiment.

Figure 22:
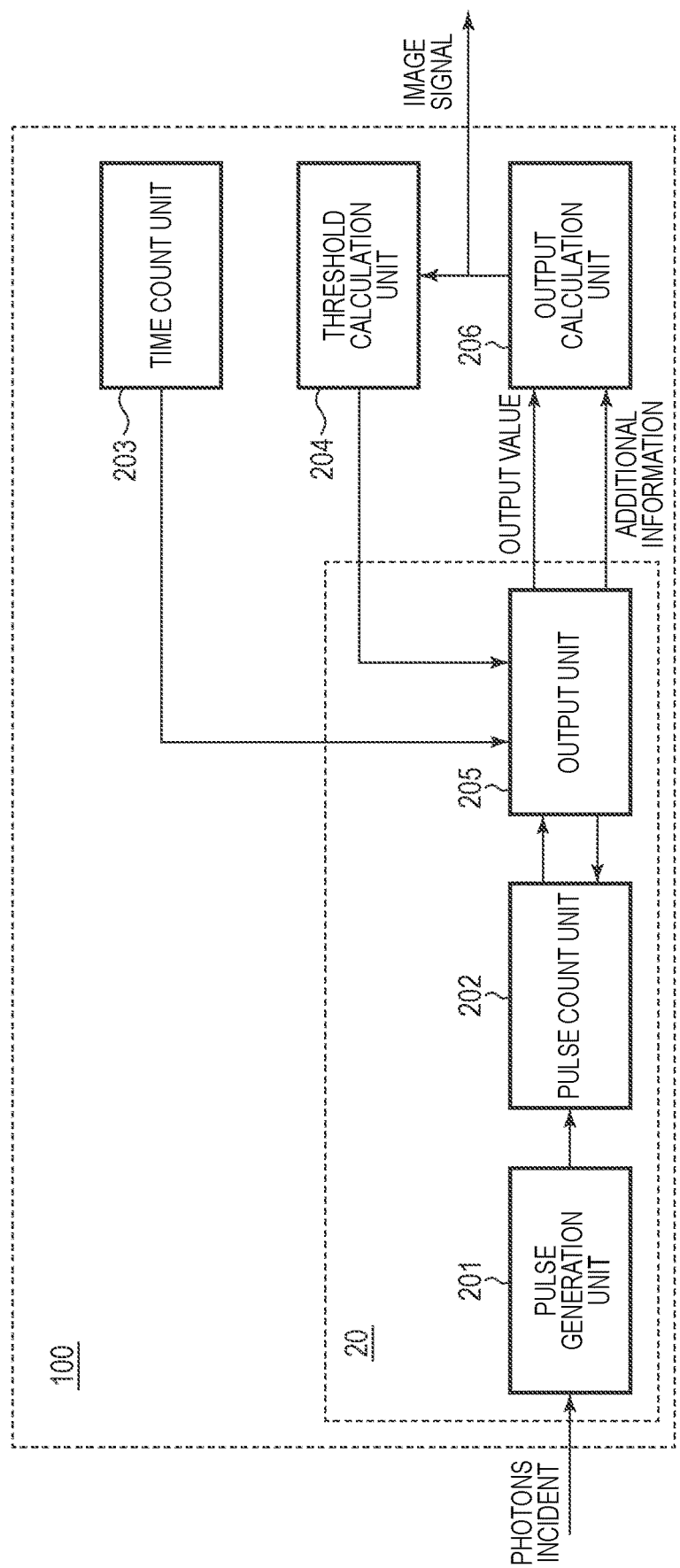
FIG. 22 is a block diagram of a photoelectric conversion device according to a fifth embodiment.

FIG. 22 is a block diagram of the photoelectric conversion device in this embodiment. In the present embodiment, the pulse generation unit 201, the pulse count unit 202, and the output unit 205 are provided in the signal processing unit 20, and the time count unit 203, the threshold calculation unit 204, and the output calculation unit 206 are provided in the photoelectric conversion device 100. Since the time count unit 203, the threshold calculation unit 204, and the output calculation unit 206 are shared by the plurality of signal processing units 20, the circuit scale can be reduced.

Although the photoelectric conversion device 100 in which the sensor substrate 1 and the circuit substrate 2 are laminated has been described in the above embodiment, the photoelectric conversion device 100 may be formed using a single substrate. In this case, the APD 11, which is a light receiving unit, may be provided in the signal processing unit 20. In the present embodiment, since the time count unit 203, the threshold calculation unit 204, and the output calculation unit 206 are provided outside the signal processing unit 20, the light receiving area of the APD 11 can be larger.

Sixth Embodiment

Next, a photoelectric conversion device according to the present embodiment will be described. The flowchart shown in FIG. 7 is merely an example, and can be modified. For example, although the difference in the change rate of the pulse count value between frames is described as an absolute value, the difference in the change rate may be expressed as a positive value or a negative value. That is, when the change rate of the pulse count value in the current frame increases from the change rate of the pulse count value in the past frame, the difference in the change rate may be represented by a positive value, and when the change rate of the pulse count value in the current frame decreases from the change rate of the pulse count value in the past frame, the difference in the change rate may be represented by a negative value.

In this case, in comparison between the change rate and the predetermined value (step S112 in FIG. 7), the predetermined value may also be represented as a positive value or a negative value.

In FIG. 7, when the pulse count value does not exceed the threshold value Th (NO in step S103), after calculating the change rate (step S107), the threshold calculation unit 204 may return to the process of step S101 without performing the threshold value changing process (steps S112 to S114). As described above, various changes can be made in the flowchart of FIG. 7, and also in the present embodiment, it is possible to reduce the current consumption while reducing the error of the image signal.

Seventh Embodiment

Figure 23:
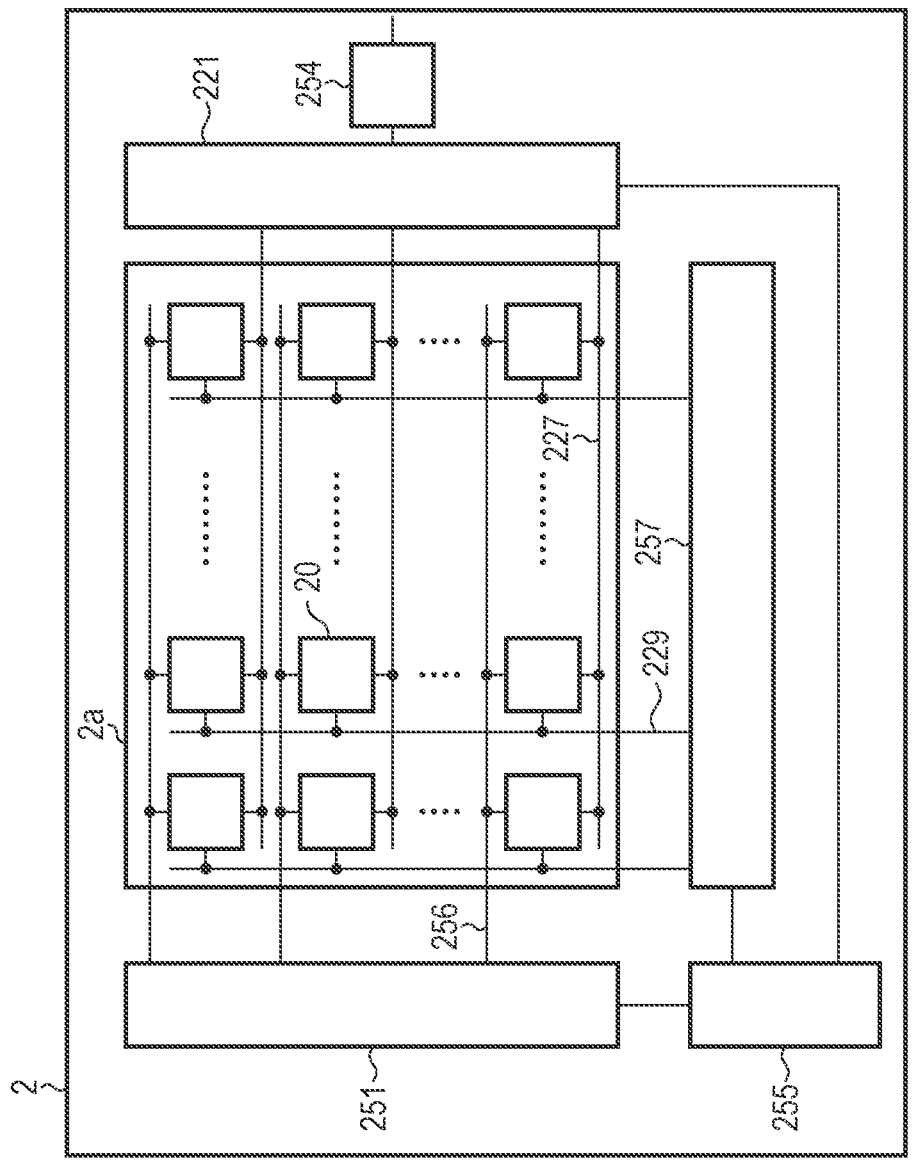
FIG. 23 is a diagram illustrating an arrangement example of a circuit substrate according to a seventh embodiment.

FIG. 23 shows an arrangement example of the circuit substrate 2 in the present embodiment, and illustrates a modified example of the arrangement of the circuit substrate 2 in FIG. 3. In FIG. 3, the readout circuit 253 reads a signal from the signal line 259 connected to the signal processing unit 20 of each column. However, in FIG. 23, a readout circuit 221 may read a signal from a signal line 227 connected to the pixels 10 in each row. Thus, the circuit substrate 2 may be configured by various arrangement examples. Also in the present embodiment, it is possible to obtain the same operation and effect as those of the above-described embodiment.

Eighth Embodiment

Figure 24:
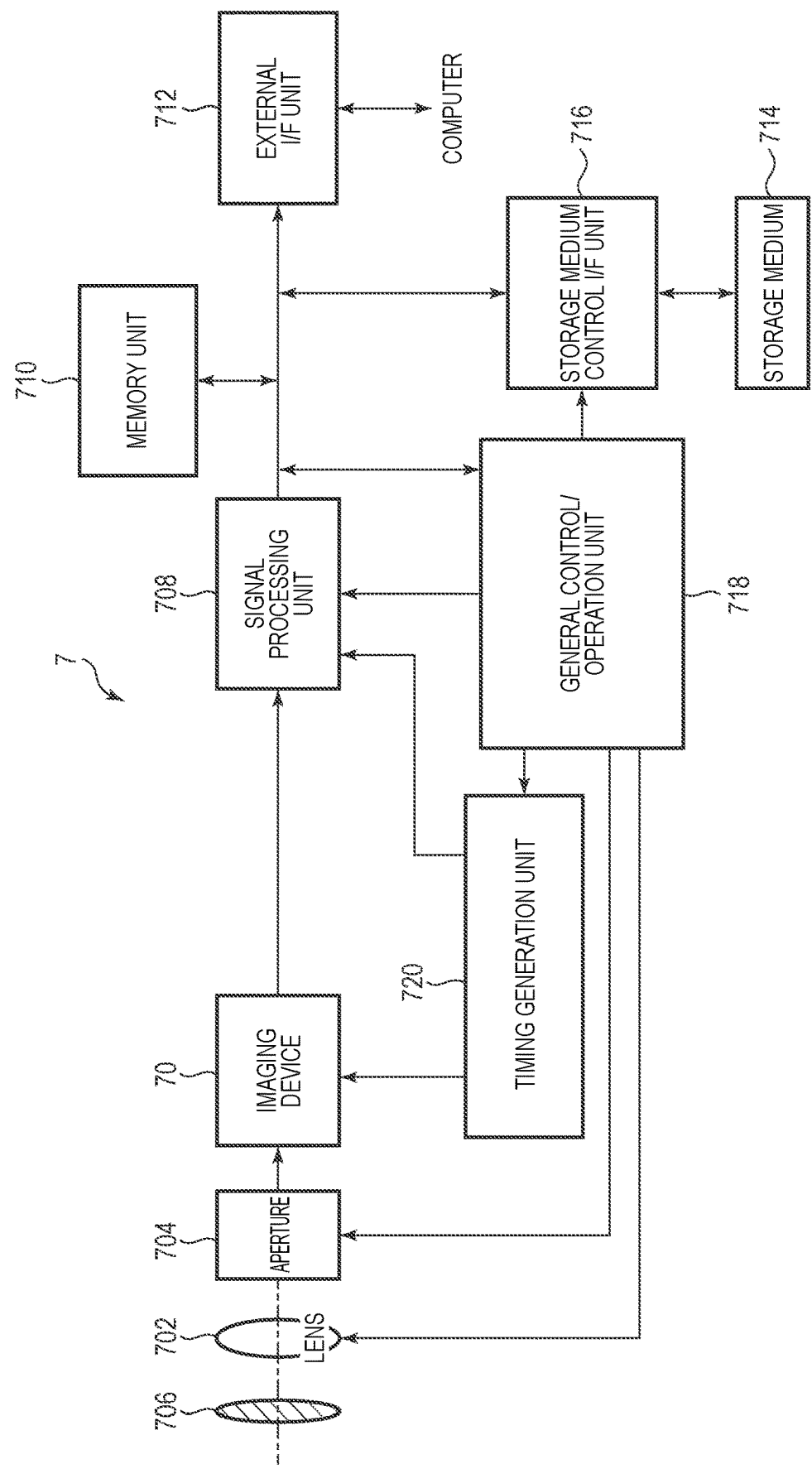
FIG. 24 is a block diagram of an imaging system according to an eighth embodiment.

FIG. 24 is a block diagram of an imaging system according to the present embodiment. The photoelectric conversion device of the above embodiments can be applied to various imaging systems. Examples of the imaging system include a digital still camera, a digital camcorder, a camera head, a copying machine, a facsimile, a mobile phone, a vehicle-mounted camera, an observation satellite, and a monitoring camera. FIG. 24 is a block diagram of a digital still camera as an example of an imaging system.

The imaging system 7 includes a barrier 706, a lens 702, an aperture 704, an imaging device 70, a signal processing unit 708, a timing generation unit 720, a general control/calculation unit 718, a memory unit 710, a storage medium control OF unit 716, a storage medium 714, and an external OF unit 712. The barrier 706 protects the lens, and the lens 702 forms an optical image of a subject on the imaging device 70. The aperture 704 varies the amount of light passing through the lens 702. The imaging device 70 is configured as in the photoelectric conversion device of the above embodiments, and converts an optical image formed by the lens 702 into image data. The signal processing unit 708 performs a compression or various corrections on the imaging data output from the imaging device 70.

The timing generation unit 720 outputs various timing signals to the imaging device 70 and the signal processing unit 708. The general control/calculation unit 718 controls the entire digital still camera, and the memory unit 710 temporarily stores image data. The storage medium control OF unit 716 is an interface for storing or reading image data on the storage medium 714, and the storage medium 714 is a detachable storage medium such as a semiconductor memory for storing or reading captured image data. An external OF unit 712 is an interface for communicating with an external computer or the like. The timing signal or the like may be input from the outside of the imaging system, and the imaging system may include at least the imaging device 70 and a signal processing unit 708 that processes an image signal output from the imaging device 70.

In the present embodiment, the imaging device 70 and the signal processing unit 708 are provided on different semiconductor substrates, but the imaging device 70 and the signal processing unit 708 may be formed on the same semiconductor substrate.

Each pixel includes a first photoelectric conversion portion and a second photoelectric conversion portion. The signal processing unit 708 processes the pixel signal based on the charge generated in the first photoelectric conversion portion and the pixel signal based on the charge generated in the second photoelectric conversion portion, and acquires the distance information from the imaging device 70 to the subject.

Ninth Embodiment

Figure 25:
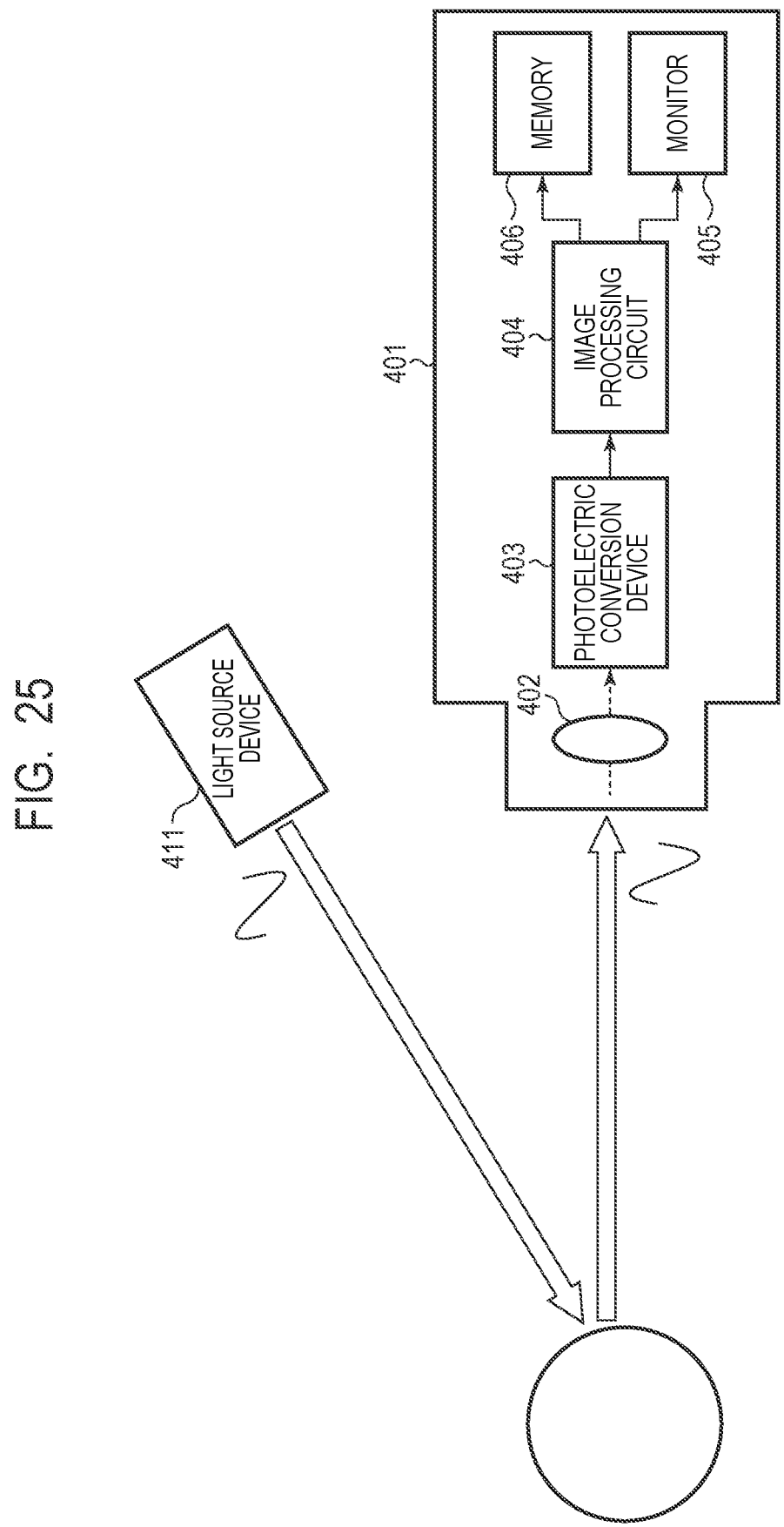
FIG. 25 is a block diagram of a light detection system according to a ninth embodiment.

FIG. 25 is a block diagram of a distance image sensor using the photoelectric conversion device described in the above embodiment.

As shown in FIG. 25, the distance image sensor 401 includes an optical system 402, a photoelectric conversion device 403, an image processing circuit 404, a monitor 405, and a memory 406. The distance image sensor 401 receives light (modulated light or pulsed light) emitted from the light source device 411 toward the subject and reflected by the surface of the subject. The distance image sensor 401 can acquire a distance image corresponding to a distance to the subject based on a time period from light emission to light reception.

The optical system 402 includes one or a plurality of lenses, and guides image light (incident light) from the subject to the photoelectric conversion device 403 to form an image on a light receiving surface (sensor portion) of the photoelectric conversion device 403.

As the photoelectric conversion device 403, the photoelectric conversion device of each of the embodiments described above can be applied. The photoelectric conversion device 403 supplies a distance signal indicating a distance obtained from the received light signal to the image processing circuit 404.

The image processing circuit 404 performs image processing for constructing a distance image based on the distance signal supplied from the photoelectric conversion device 403. The distance image (image data) obtained by the image processing can be displayed on the monitor 405 and stored (recorded) in the memory 406.

By applying the photoelectric conversion device described above, the distance image sensor 401 configured in this manner can acquire a more accurate distance image as the characteristics of the pixel are improved.

Tenth Embodiment

The technology according to the present disclosure can be applied to various products. For example, the techniques according to the present disclosure may be applied to an endoscopic surgical system.

Figure 26:
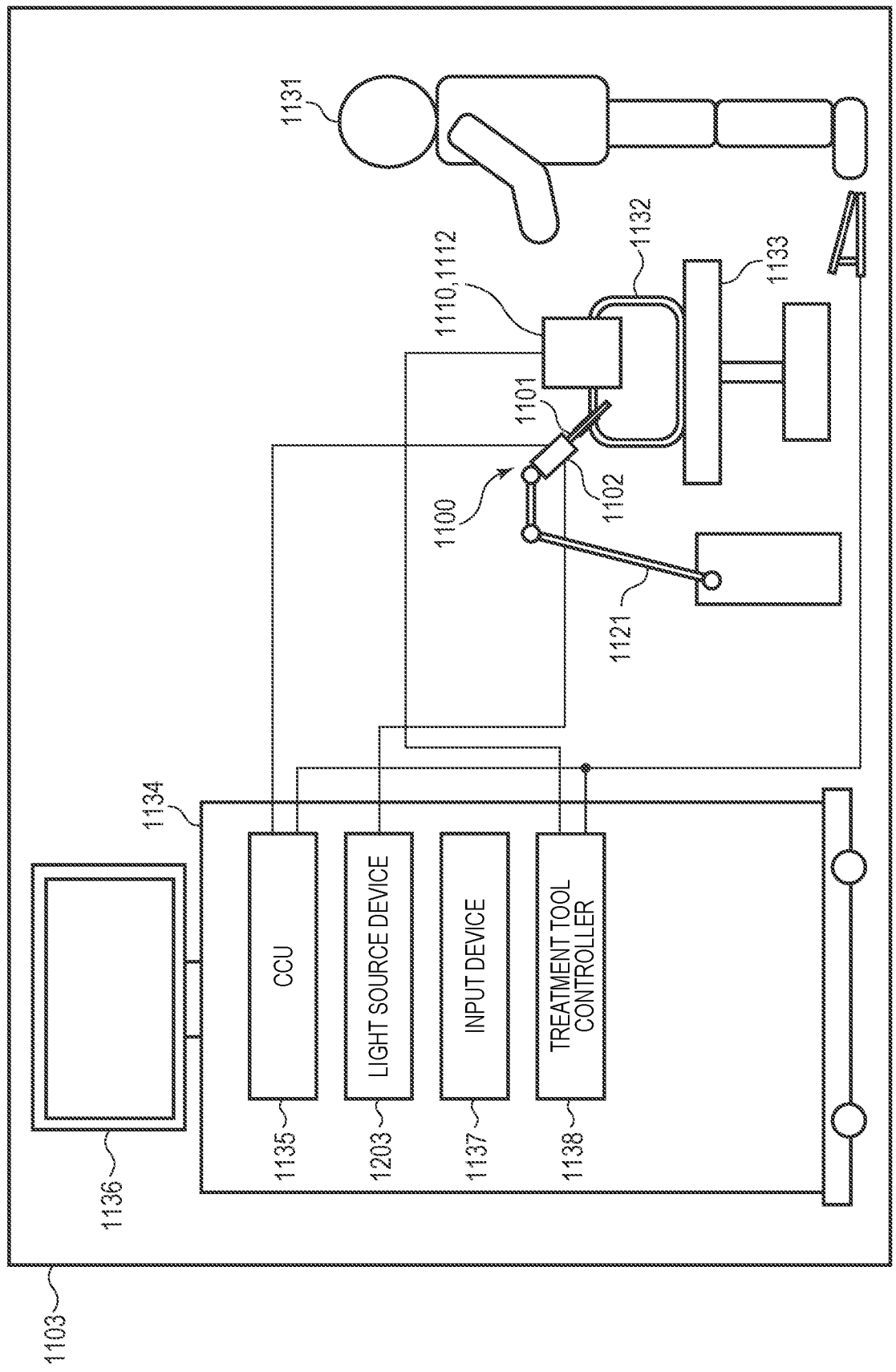
FIG. 26 is a schematic diagram of an endoscopic surgery system according to a tenth embodiment.

FIG. 26 is a schematic diagram of an endoscopic surgery system according to the present embodiment. FIG. 26 illustrates a state in which an operator (physician) 1131 performs surgery on a patient 1132 on a patient bed 1133 using an endoscopic surgical system 1103. As illustrated, the endoscopic surgical system 1103 includes an endoscope 1100, a surgical tool 1110, and a cart 1134 on which various devices for endoscopic surgery are mounted.

Figure 27A:
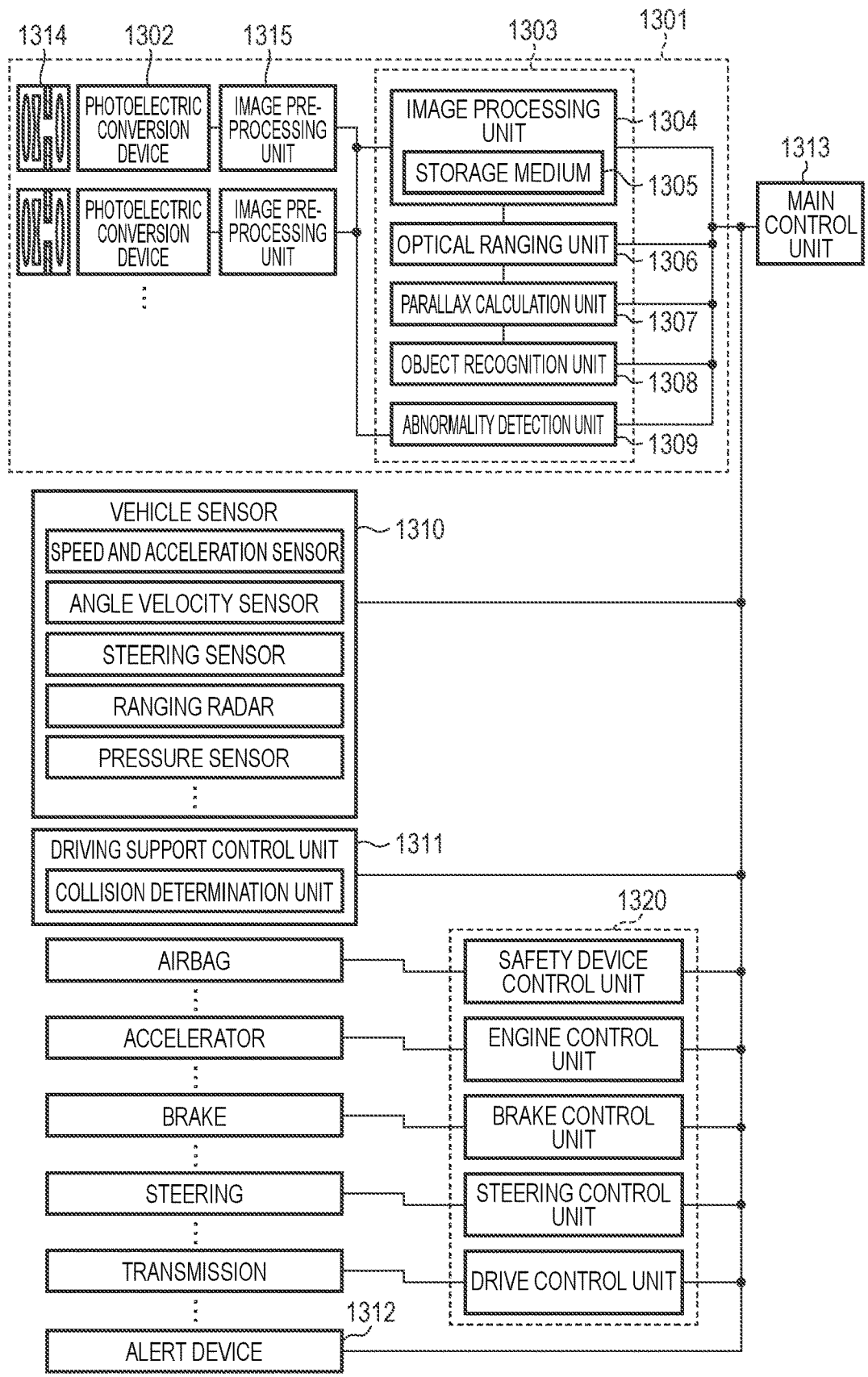
FIG. 27A is a schematic diagram of a light detection system according to an eleventh embodiment.
Figure 27B:
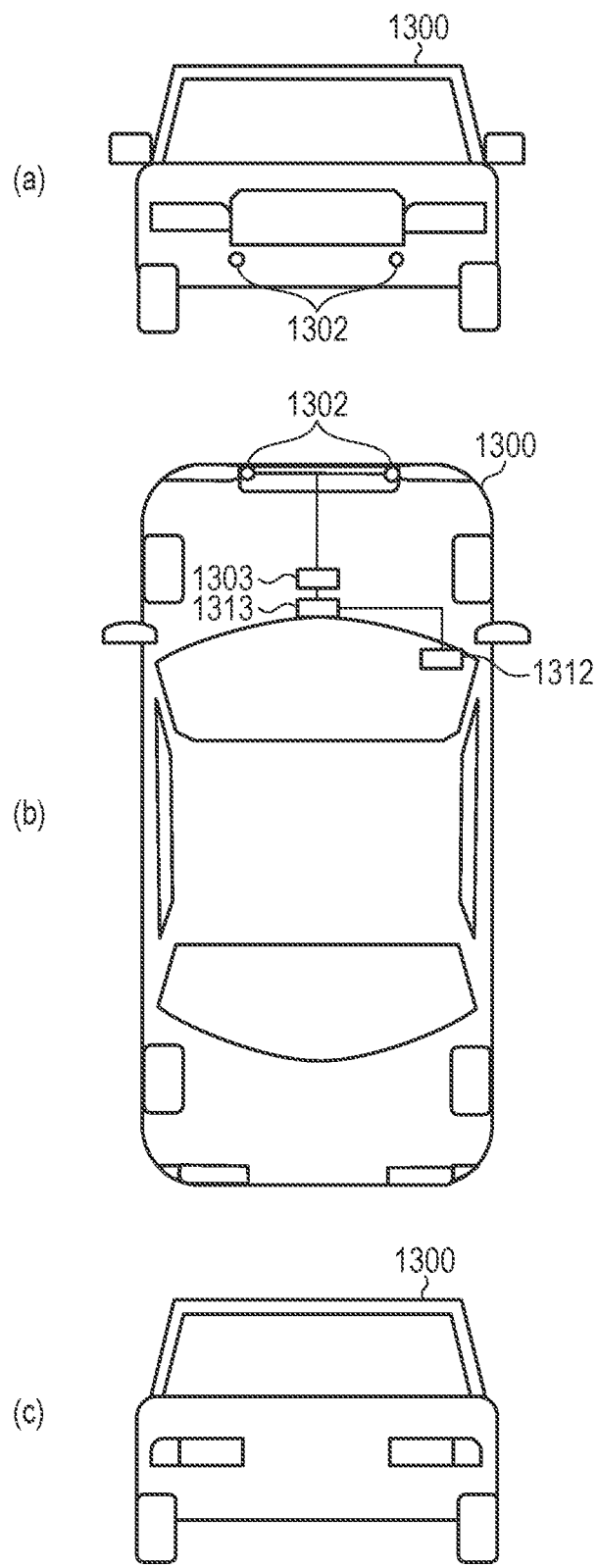
FIG. 27B is a schematic diagram of a mobile body according to a twelfth embodiment.

The endoscope 1100 includes a lens barrel 1101 in which an area of a predetermined length from the distal end is inserted into a body cavity of a patient 1132, a camera head 1102 connected to a proximal end of the lens barrel 1101, and an arm 1121. Although FIGS. 27A and 27B illustrate the endoscope 1100 configured as a rigid mirror having a rigid type of the lens barrel 1101, the endoscope 1100 may be configured as a flexible mirror having a flexible type of the lens barrel 1101.

An opening into which the objective lens is fitted is provided at the tip of the lens barrel 1101. A light source device 1203 is connected to the endoscope 1100, and light generated by the light source device 1203 is guided to the tip of the lens barrel 1101 by a light guide extended inside the lens barrel 1101, and is irradiated to an observation target in the body cavity of the patient 1132 via an objective lens. The endoscope 1100 may be a direct vision mirror, a swash mirror, or a side vision mirror.

An optical system and a photoelectric conversion device are provided inside the camera head 1102, and reflected light (observation light) from an observation target is focused on the photoelectric conversion device by the optical system. The observation light is photoelectrically converted by the photoelectric conversion device, and an electric signal corresponding to the observation light, that is, an image signal corresponding to the observation image is generated. The photoelectric conversion device described in each of the above embodiments can be used as the photoelectric conversion device. The image signal is transmitted as RAW data to a camera control unit (CCU) 1135.

The CCU 1135 includes a CPU (Central Processing Unit), a GPU (Graphics Processing Unit), and the like, and integrally controls the operation of the endoscope 1100 and the display device 1136. Further, the CCU 1135 receives an image signal from the camera head 1102, and performs various types of image processing for displaying an image based on the image signal, such as a development processing (demosaic processing), on the image signal.

The display device 1136 displays an image based on the image signal processed by the CCU 1135 under the control of the CCU 1135.

The light source device 1203 includes a light source such as an LED (Light Emitting Diode), and supplies irradiation light to the endoscope 1100 when capturing an operation part or the like.

Input device 1137 is an input interface for endoscopic surgical system 1103. The user can input various kinds of information and instructions to the endoscopic surgical system 1103 via the input device 1137.

The treatment tool controller 1138 controls driving of an energy treatment tool 1112 for ablation of tissue, incision or vessel sealing, etc.

The light source device 1203 can supply irradiation light to the endoscope 1100 when capturing the surgical part, and may be a white light source such as an LED, a laser light source, or a combination thereof. When a white light source is configured by a combination of RGB laser light sources, an output intensity and output timing of each color (each wavelength) can be controlled with high accuracy. Therefore, the light source device 1203 can adjust the white balance of the captured image. In this case, laser light from each of the RGB laser light sources may be irradiated onto the observation target in a time-division manner, and driving of the imaging element of the camera head 1102 may be controlled in synchronization with the irradiation timing. Thus, images corresponding to RGB can be captured in a time-division manner. According to such a method, a color image can be obtained without providing a color filter in the imaging element.

Further, the driving of the light source device 1203 may be controlled so that the intensity of the light output from the light source device 1203 is changed every predetermined time. By controlling the driving of the imaging element of the camera head 1102 in synchronization with the timing of changing the intensity of light to acquire an image in a time-division manner and synthesizing the image, it is possible to generate an image of a high dynamic range that does not cause black blur and white blur.

Further, the light source device 1203 may be configured to be capable of supplying light in a predetermined wavelength band corresponding to the special light observation. In special light observation, for example, wavelength dependency of absorption of light in body tissue can be utilized. Specifically, predetermined tissues such as blood vessels in the mucous membrane surface layer are captured with high contrast by irradiating light in a narrower band than irradiation light (i.e., white light) during normal observation. Alternatively, in special light observation, fluorescence observation for obtaining an image by fluorescence generated by irradiation with excitation light may be performed. In fluorescence observation, the body tissue can be irradiated with excitation light to observe fluorescence from the body tissue, or a reagent such as indocyanine green (ICG) can be locally injected to the body tissue, and the body tissue can be irradiated with excitation light corresponding to the fluorescence wavelength of the reagent to obtain a fluorescence image. The light source device 1203 may be configured to supply narrowband light and/or excitation light corresponding to such special light observation.

Eleventh Embodiment

Figure 28:
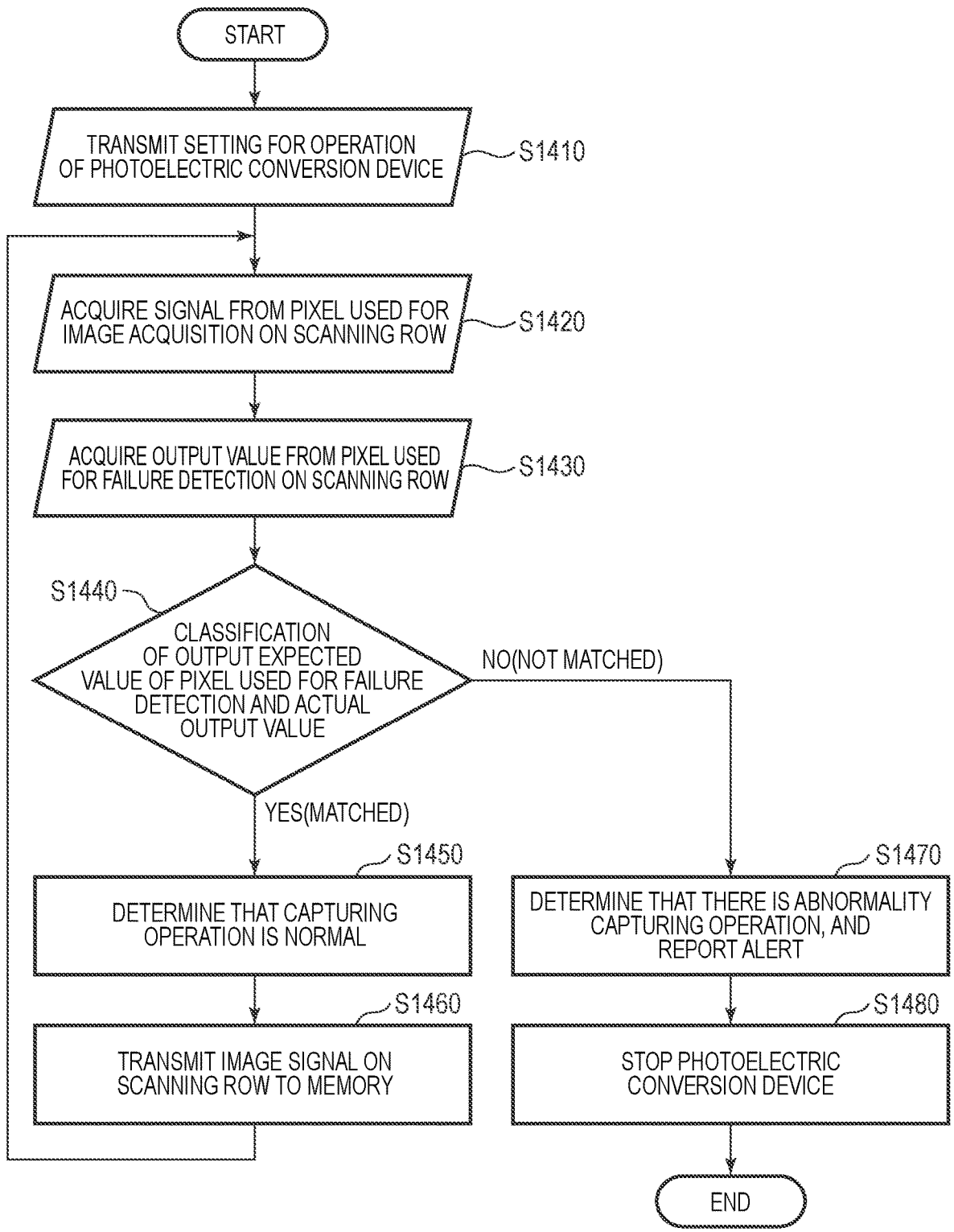
FIG. 28 is a flowchart illustrating the operation of a light detection system according to a thirteenth embodiment.

A light detection system and a mobile body of the present embodiment will be described with reference to FIGS. 27A, 27B, and 28. In the present embodiment, an example of a vehicle-mounted camera is shown as the light detection system.

FIG. 27A is a schematic diagram of the light detection system according to the present embodiment, and illustrates an example of a vehicle system and the light detection system mounted on the vehicle system. The light detection system 1301 includes a photoelectric conversion device 1302, an image pre-processing unit 1315, an integrated circuit 1303, and an optical system 1314. The optical system 1314 forms an optical image of a subject on the photoelectric conversion device 1302. The photoelectric conversion device 1302 converts an optical image of a subject formed by the optical system 1314 into an electric signal. The photoelectric conversion device 1302 is the photoelectric conversion device of any one of the above-described embodiments. The image pre-processing unit 1315 performs predetermined signal processing on the signal output from the photoelectric conversion device 1302. The function of the image pre-processing unit 1315 may be incorporated in the photoelectric conversion device 1302. The light detection system 1301 is provided with at least two sets of the optical system 1314, a photoelectric conversion device 1302, and the image pre-processing unit 1315, and outputs from each set of image pre-processing units 1315 are input to the integrated circuit 1303.

The integrated circuit 1303 is an integrated circuit for use in an imaging system, and includes an image processing unit 1304 including a storage medium 1305, an optical distance measuring unit 1306, a parallax calculation unit 1307, an object recognition unit 1308, and an abnormality detection unit 1309. The image processing unit 1304 performs image processing such as development processing and defect correction on the output signal of the image pre-processing unit 1315. The storage medium 1305 functions as a primary storage of the captured image and stores defect positions of the captured pixels. The optical distance measuring unit 1306 focuses a subject and measures distance. The parallax calculation unit 1307 calculates distance measurement information from a plurality of image data acquired by the plurality of photoelectric conversion devices 1302. The object recognition unit 1308 recognizes a subject such as a car, a road, a marker, or a person. When the abnormality detection unit 1309 detects the abnormality of the photoelectric conversion device 1302, the abnormality detection unit 1309 notifies a main control unit 1313 of the abnormality.

The integrated circuit 1303 may be configured with a dedicated hardware, a software module, or a combination thereof. Further, it may be configured with FPGA (Field Programmable Gate Array), ASIC (Application Specific Integrated Circuit), or the like, or may be configured with a combination of these.

The main control unit 1313 comprehensively controls operations of the light detection system 1301, the vehicle sensor 1310, the control unit 1320, and the like. Without the main control unit 1313, the light detection system 1301, the vehicle sensor 1310, and the control unit 1320 each may have a communication interface, and each of them may transmit and receive a control signal via a communication network according to, for example, the CAN standard.

The integrated circuit 1303 has a function of receiving a control signal from the main control unit 1313 or transmitting the control signal and a setting value to the photoelectric conversion device 1302 by its own control unit.

The light detection system 1301 is connected to the vehicle sensor 1310, and can detect a traveling state of the host vehicle such as a vehicle speed, a yaw rate, a steering angle, and the like, an environment outside the host vehicle, and states of other vehicles and obstacles. The vehicle sensor 1310 is also a distance information acquiring unit that acquires distance information to an object. The light detection system 1301 is connected to a driving support control unit 1311 that performs various driving support functions such as an automatic steering function, an automatic cruise function, and a collision prevention function. In particular, with regard to the collision determination function, based on the detection results of the light detection system 1301 and the vehicle sensor 1310, it is determined whether or not there is a collision with another vehicle or an obstacle. Thus, avoidance control when a collision is estimated and activation of the safety device at the time of collision are performed.

The light detection system 1301 is also connected to an alert device 1312 that issues an alert to a driver based on the determination result of the collision determination unit. For example, when a collision possibility is high as the determination result of the collision determination unit, the main control unit 1313 performs vehicle control such as braking, returning an accelerator, suppressing engine output, and the like, thereby avoiding collision and reducing damage. The alert device 1312 issues a warning to a user using means such as alerting such as a sound, displaying alert information on a display screen such as a car navigation system and a meter panel, and giving vibration to a seatbelt and a steering wheel.

The light detection system 1301 according to the present embodiment can capture an image around the vehicle, for example, a front or a rear. FIG. 27B is a schematic diagram of a moving object according to the present embodiment, and illustrates a configuration in which an image is captured in front of the vehicle by the light detection system 1301.

The two photoelectric conversion devices 1302 are disposed in front of the vehicle 1300. Specifically, it is preferable that a center line with respect to a forward/backward direction or an outer shape (e.g., a vehicle width) of the vehicle 1300 is regarded as a symmetry axis, and two photoelectric conversion devices 1302 are disposed axisymmetrically with respect to the symmetry axis. This makes it possible to effectively acquire distance information between the vehicle 1300 and the object to be imaged and determine the possibility of collision. Further, it is preferable that the photoelectric conversion devices 1302 are disposed at a position where it does not obstruct the field of view of the driver when the driver sees a situation outside the vehicle 1300 from the driver's seat. The alert device 1312 is preferably disposed at a position where the driver can easily look around.

Next, a failure detection operation of the photoelectric conversion device 1302 in the light detection system 1301 will be described with reference to FIG. 28. FIG. 28 is a flowchart illustrating the operation of the light detection system according to the present embodiment. The failure detection operation of the photoelectric conversion device 1302 may be performed according to steps S1410 to S1480.

In step S1410, a setting at the time of start-up of the photoelectric conversion device 1302 is performed. That is, setting information for the operation of the photoelectric conversion device 1302 is transmitted from the outside of the light detection system 1301 (for example, the main control unit 1313) or the inside of the light detection system 1301, and the photoelectric conversion device 1302 starts an imaging operation and a failure detection operation.

Next, in step S1420, the photoelectric conversion device 1302 acquires pixel signals from the effective pixels. In step S1430, the photoelectric conversion device 1302 acquires an output value from a failure detection pixel provided for failure detection. The failure detection pixel includes a photoelectric conversion element as in the case of the effective pixel. A predetermined voltage is written to the photoelectric conversion element. The failure detection pixel outputs a signal corresponding to the voltage written to the photoelectric conversion element. Step S1420 and step S1430 may be executed in reverse order.

Next, in step S1440, the light detection system 1301 performs non-determination between the expected output value of the fault detection pixel and the output value from the actual fault detection pixel. When it is determined in step S1440 that the expected output value matches the actual output value, the light detection system 1301 proceeds to step S1450, determines that the imaging operation is normally performed, and proceeds to step S1460. In step S1460, the light detection system 1301 transmits the pixel signals of the scanning row to the storage medium 1305 and temporarily stores them. Thereafter, the light detection system 1301 returns to the process of step S1420 to continue the failure detection operation. On the other hand, as a result of the non-determination in step S1440, when the expected output value does not match the actual output value, the light detection system 1301 proceeds to the process of step S1470. In step S1470, the light detection system 1301 determines that there is an abnormality in the imaging operation, and issues an alarm to the main control unit 1313 or the alert device 1312. The alert device 1312 causes the display unit to display that an abnormality has been detected. Then, in step S1480, the light detection system 1301 stops the photoelectric conversion device 1302 and ends the operation of the light detection system 1301.

Although the present embodiment exemplifies the example in which the flowchart is looped for each row, the flowchart may be looped for each plurality of rows, or the failure detection operation may be performed for each frame. The alarm of step S1470 may be notified to the outside of the vehicle via the wireless network.

Further, in the present embodiment, the control that does not collide with other vehicles has been described, but the present invention is also applicable to a control that automatically drives the vehicles following the other vehicles, a control that automatically drives the vehicles so as not to go out of the lane, and the like. Further, the light detection system 1301 is not limited to a vehicle such as a host vehicle, and can be applied to, for example, a mobile body (moving device) such as a ship, an aircraft, or an industrial robot. In addition, the present invention can be applied not only to a mobile body but also to a wide variety of equipment such as an advanced road traffic system (ITS). The photoelectric conversion device of the present invention may further have a configuration capable of acquiring various kinds of information such as distance information.

Twelfth Embodiment

Figure 29A:
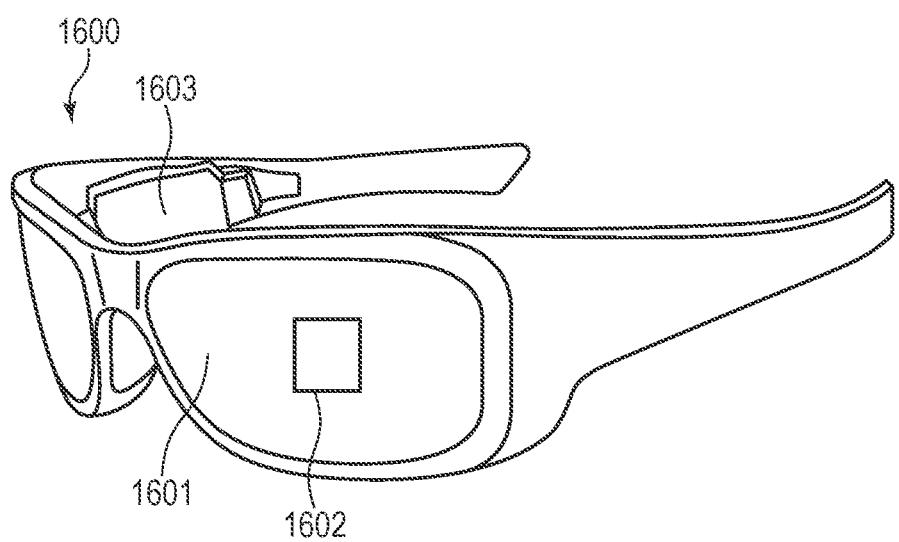
FIGS. 29A and 29B are diagrams illustrating a specific example of an electronic apparatus of the first embodiment.

FIG. 29A is a diagram illustrating a specific example of an electronic apparatus according to the present embodiment, and illustrates glasses 1600 (smart glasses). The glasses 1600 are provided with a photoelectric conversion device 1602 described in the above embodiments. A display device including a light emitting device such as an OLED or an LED may be provided on the back surface side of the lens 1601. One photoelectric conversion device 1602 or a plurality of photoelectric conversion devices 1602 may be provided. Further, a plurality of kinds of photoelectric conversion devices may be combined. The arrangement position of the photoelectric conversion device 1602 is not limited to that shown in FIG. 29A.

The glasses 1600 further comprise a control device 1603. The control device 1603 functions as a power source for supplying power to the photoelectric conversion device 1602 and the display device. The control device 1603 controls operations of the photoelectric conversion device 1602 and the display device. An optical system for collecting light to the photoelectric conversion device 1602 is formed in the lens 1601.

Figure 29B:
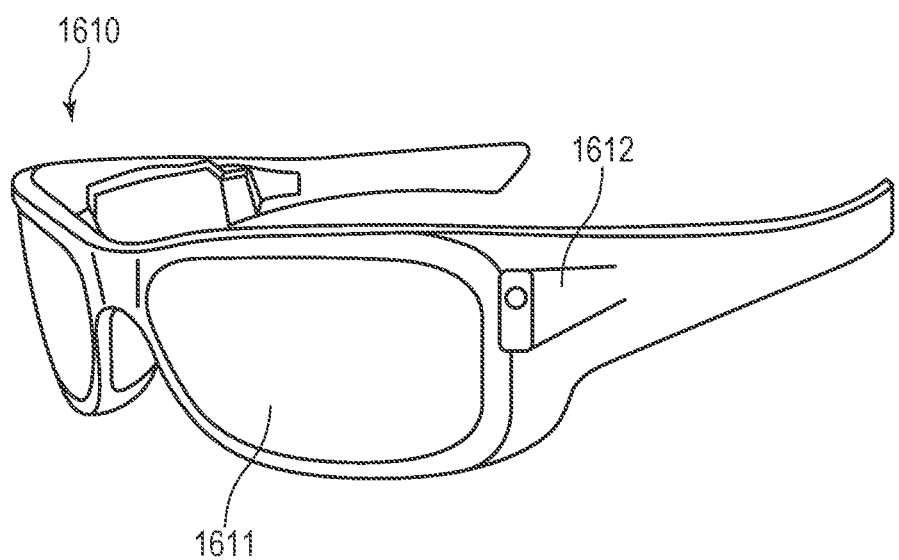

FIG. 29B illustrates glasses 1610 (smart glasses) according to one application. The glasses 1610 include a control device 1612, and a photoelectric conversion device corresponding to the photoelectric conversion device 1602 and a display device are mounted on the control device 1612. The lens 1611 is formed with a photoelectric conversion device in the control device 1612 and an optical system for projecting light emitted from a display device, and an image is projected onto the lens 1611. The control device 1612 functions as a power source for supplying power to the photoelectric conversion device and the display device, and controls operations of the photoelectric conversion device and the display device. The control device 1612 may include a line-of-sight detection unit that detects the line of sight of the wearer. Infrared radiation may be used to detect the line of sight. The infrared light emitting unit emits infrared light to the eyeball of the user who is watching the display image. The reflected light of the emitted infrared light from the eyeball is detected by the imaging unit having the light receiving element, whereby a captured image of the eyeball is obtained. By providing a reduction unit that reduces light from the infrared light emitting unit to the display unit in a plan view, a decrease in image quality is reduced.

The line of sight of the user with respect to the display image is detected from the captured image of the eyeball obtained by imaging the infrared light. Any known method can be applied to the line-of-sight detection using the captured image of the eyeball. As an example, a line-of-sight detection method based on a Purkinje image due to reflection of irradiation light at the cornea can be used.

More specifically, a visual line detection process based on the pupil cornea reflection method is performed. By using the pupil cornea reflection method, a line-of-sight vector representing the direction (rotation angle) of the eyeball is calculated based on the image of the pupil included in the captured image of the eyeball and the Purkinje image, whereby the line-of-sight of the user is detected.

The display device of the present embodiment may include a photoelectric conversion device having a light receiving element, and may control a display image of the display device based on the line-of-sight information of the user from the photoelectric conversion device.

Specifically, the display device determines a first view field area to be gazed by the user and a second view field area other than the first view field area based on the line-of-sight information. The first view field area and the second view field area may be determined by a control device of the display device, or may be determined by an external control device. In the display area of the display device, the display resolution of the first viewing area may be controlled to be higher than the display resolution of the second viewing area. That is, the resolution of the second viewing area may be lower than that of the first viewing area.

The display area may include a first display area and a second display area different from the first display area. A high priority area may be determined from the first display area and the second display area based on the line-of-sight information. The first view field area and the second view field area may be determined by the control device of the display device, or may be determined by the external control device. The resolution of the high priority area may be controlled to be higher than the resolution of the area other than the high priority area. That is, the resolution of an area having a relatively low priority can be reduced.

Note that an AI (Artificial Intelligence) may be used in the determination of the first view field area and the area with high priority. The AI may be a model configured to estimate a distance from an image of an eyeball to an angle of a line of sight and a target object ahead of the line of sight, using an image of the eyeball and a direction in which the eyeball of the image is actually viewed as teacher data. The AI program may be provided in either a display device or a photoelectric conversion device, or may be provided in an external device. When the external device has the AI program, the AI program may be transmitted from a server or the like to a display device via communication.

When the display control is performed based on the visual recognition detection, the present embodiment can be preferably applied to a smart glass which further includes a photoelectric conversion device for capturing an image of the outside. The smart glass can display captured external information in real time.

Other Embodiments Thereof

The present invention is not limited to the above embodiment, and various modifications are possible. For example, an example in which some of the configurations of any of the embodiments are added to other embodiments and an example in which some of the configurations of any of the embodiments are replaced with some of the configurations of other embodiments are also embodiments of the present invention.

The present invention can also be implemented by a process in which a program for implementing one or more functions of the above-described embodiments is supplied to a system or apparatus via a network or a storage medium, and one or more processors in a computer of the system or apparatus read and execute the program. The present invention can also be implemented by a circuit (e.g., ASIC) that realizes one or more functions.

It should be noted that any of the embodiments described above is merely an example of an embodiment for carrying out the present invention, and the technical scope of the present invention should not be construed as being limited by the embodiments. That is, the present invention can be implemented in various forms without departing from the technical idea or the main features thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-000027, filed Jan. 1, 2022, which is hereby incorporated by reference herein in its entirety.

What is claimed is:

1. A photoelectric conversion device comprising:
an avalanche photodiode;
a pulse generation unit that converts an output from the avalanche photodiode into a pulse signal;
a pulse count unit that counts the pulse signal and outputs a pulse count value;
a time count unit that outputs a time count value indicating a time from the start of operation of the pulse generation unit;
an output unit that, when the pulse count value does not exceed a threshold value, outputs the pulse count value, and when the pulse count value exceeds the threshold value, ends counting in the pulse count unit and outputs the time count value at the time of the pulse count value exceeding the threshold value; and
a threshold setting unit that changes the threshold value using the time count value.

2. The photoelectric conversion device according to claim 1, wherein the output unit outputs the threshold value when the pulse count value exceeds the threshold value.

3. The photoelectric conversion device according to claim 1, wherein the output unit outputs a unique value indicating whether or not the pulse count value exceeds the threshold value.

4. The photoelectric conversion device according to claim 1, further comprising an output calculation unit that, when the pulse count value exceeds the threshold value, calculates the pulse count value after exceeding the threshold value based on a ratio between the time count value and the threshold value at a time of the pulse count value exceeding the threshold value.

5. The photoelectric conversion device according to claim 1,
wherein the threshold setting unit is configured to:
calculate a change rate of the pulse count value based on the pulse count value and the time count value corresponding to the pulse count value when the pulse count value does not exceed the threshold value;
calculate a change rate of the pulse count value based on the time count value at a time when the pulse count value exceeds the threshold value and the threshold value when the pulse count value exceeds the threshold value;
calculate a difference between the change rate in a first frame and the change rate in a second frame after the first frame; and
decrease the threshold value when the difference is equal to or lower than a predetermined value, and increase the threshold value when the difference exceeds the predetermined value.

6. The photoelectric conversion device according to claim 1,
wherein the threshold setting unit is configured to:
compare a difference between the pulse count value output in a first frame and the pulse count value output in a second frame after the first frame; and
decrease the threshold value when the difference is equal to or lower than a predetermined value, and increase the threshold value when the difference exceeds the predetermined value.

7. The photoelectric conversion device according to claim 1,
wherein the threshold setting unit is configured to change the threshold value in a range of an upper limit value and a lower limit value other than the most significant bit and the least significant bit of the pulse count value.

8. The photoelectric conversion device according to claim 1,
wherein the first frame and the second frame are a first sub-frame and a second sub-frame which are divided from one frame and are adjacent to each other in a time domain, and
wherein the pulse count value of the first sub-frame and the pulse count value of the second sub-frame are combined to be output as the pulse count value of one frame.

9. The photoelectric conversion device according to claim 7, wherein the threshold setting unit increases the threshold value to the upper limit value when the difference exceeds the predetermined value.

10. The photoelectric conversion device according to claim 5, wherein the threshold setting unit determines the predetermined value according to the threshold value.

11. The photoelectric conversion device according to claim 5, wherein the threshold setting unit decreases the threshold value by a predetermined amount when the difference is equal to or smaller than the predetermined value.

12. The photoelectric conversion device according to claim 11, wherein the threshold setting unit determines the predetermined amount according to the difference.

13. The photoelectric conversion device according to claim 11, wherein the threshold setting unit decreases the predetermined amount as the threshold value becomes smaller.

14. The photoelectric conversion device according to claim 5, wherein even if the pulse count value exceeds the threshold value, the threshold setting unit does not change the threshold value in a predetermined number of frame periods after a start of imaging.

15. The photoelectric conversion device according to claim 5, further comprising a plurality of pixel circuits provided corresponding to the plurality of avalanche photodiodes arranged in an array, wherein the time count unit and the threshold setting unit are shared by the plurality of pixel circuits.

16. The photoelectric conversion device according to claim 15, further comprising a plurality of pixel blocks each including a plurality of pixel circuits,
wherein the time count unit and the threshold setting unit are provided for each pixel block.

17. The photoelectric conversion device according to claim 1, wherein a first substrate provided with a plurality of the avalanche photodiodes and a second substrate provided with a plurality of the pixel circuits are stacked.

18. A light detection system comprising:
the photoelectric conversion device according to claim 1; and
a signal processing device that processes a signal output from the photoelectric conversion device.

19. The light detection system according to claim 18, wherein the signal processing device generates a distance image representing distance information to an object based on the signal.

20. A mobile body comprising:
the photoelectric conversion device according to claim 1;
a distance information acquiring unit that acquires distance information to an object, from a parallax image based on a signal from the photoelectric conversion device; and
a control unit that controls the mobile body based on the distance information.

* * * * *